United States Patent
Sharpe-Geisler

(10) Patent No.: US 6,798,244 B1
(45) Date of Patent: Sep. 28, 2004

(54) OUTPUT BUFFER WITH OVERVOLTAGE PROTECTION

(75) Inventor: Bradley A. Sharpe-Geisler, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 71 days.

(21) Appl. No.: 10/151,753

(22) Filed: May 16, 2002

(51) Int. Cl.$^7$ .......................................... H03K 19/0175
(52) U.S. Cl. ............................... 326/81; 81/83; 81/121; 327/318
(58) Field of Search ..................... 326/81, 80, 83, 326/82, 121, 62, 63, 68; 327/112, 534, 319, 309, 331, 333, 318, 320

(56) References Cited

U.S. PATENT DOCUMENTS

| | | | |
|---|---|---|---|
| 5,880,603 A * | 3/1999 | Shigehara et al. | 326/81 |
| 5,929,667 A * | 7/1999 | Abadeer et al. | 327/112 |
| 6,028,758 A | 2/2000 | Sharpe-Geisler | 361/111 |
| 6,031,365 A | 2/2000 | Sharpe-Geisler | 323/313 |
| 6,255,850 B1 * | 7/2001 | Turner | 326/81 |
| 6,265,926 B1 * | 7/2001 | Wong | 327/318 |

OTHER PUBLICATIONS

U.S. patent application Ser. No. 10/146,739, Sharpe–Geisler, filed May 16, 2002.
U.S. patent application Ser. No. 10/146,826, Sharpe–Geisler, filed May 16, 2002.
U.S. patent application Ser. No. 10/146,769, Sharpe–Geisler, filed May 16, 2002.
U.S. patent application Ser. No. 10/147,199, Sharpe–Geisler, filed May 16, 2002.
U.S. patent application Ser. No. 10/146,734, Sharpe–Geisler, filed May 16, 2002.
U.S. patent application Ser. No. 10/147,011, Sharpe–Geisler, filed May 16, 2002.

* cited by examiner

*Primary Examiner*—Vibol Tan

(57) ABSTRACT

An input/output buffer is provided with an output buffer portion which can be used to make an integrated circuit selectively compatible with one of a number of interface types, such as PCI, GTL, PECL, ECL and SSTI. An output buffer portion has an input for receiving an output signal node (D) where components on the integrated circuit provide an output signal for connecting to external circuits at an output pad (PAD). The input buffer includes switching circuitry driving the gates of multiple CMOS buffer transistors to provide sufficient current for rapid switching, and limit current after switching to prepare for a subsequent output transition. The switching circuitry includes components to prevent damage to low voltage transistors used in the output buffer should the output pad (PAD) voltage exceed VDD, or should charge buildup occur on the common well of PMOS transistors used in the output buffer exceed VDD.

14 Claims, 27 Drawing Sheets

PCI Mode

GTL Mode

PECL Mode

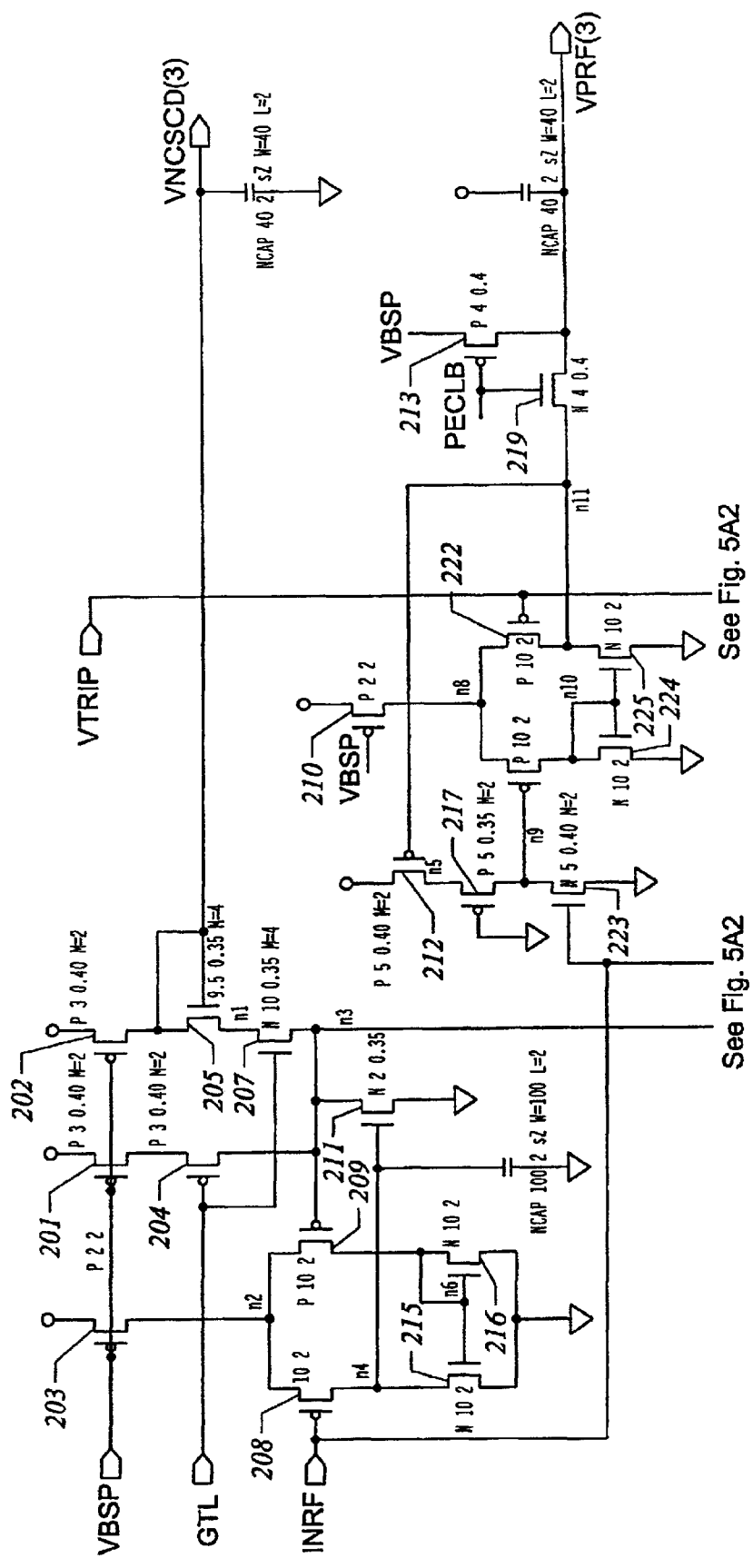
FIG. 5A1

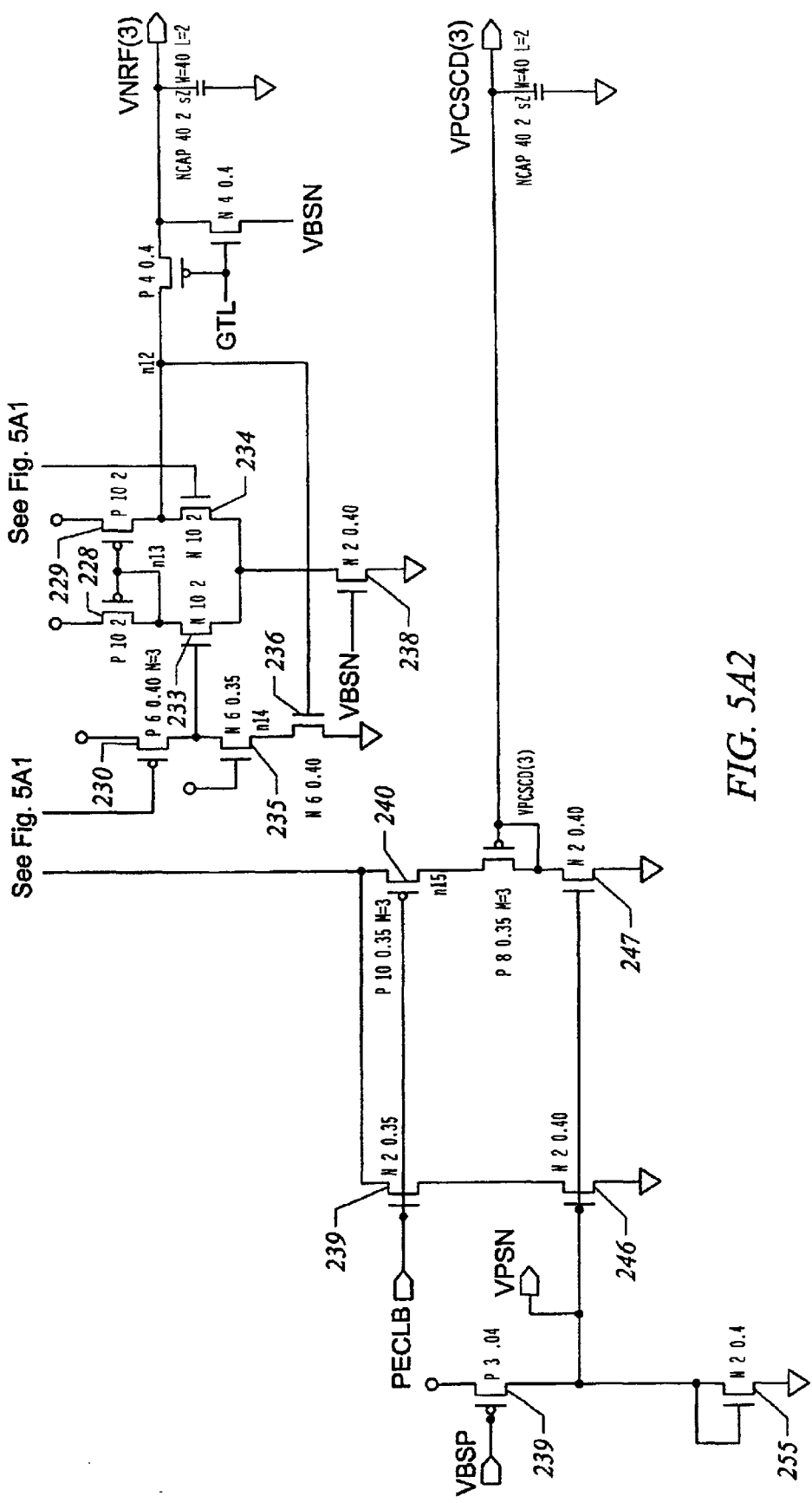
FIG. 5A2

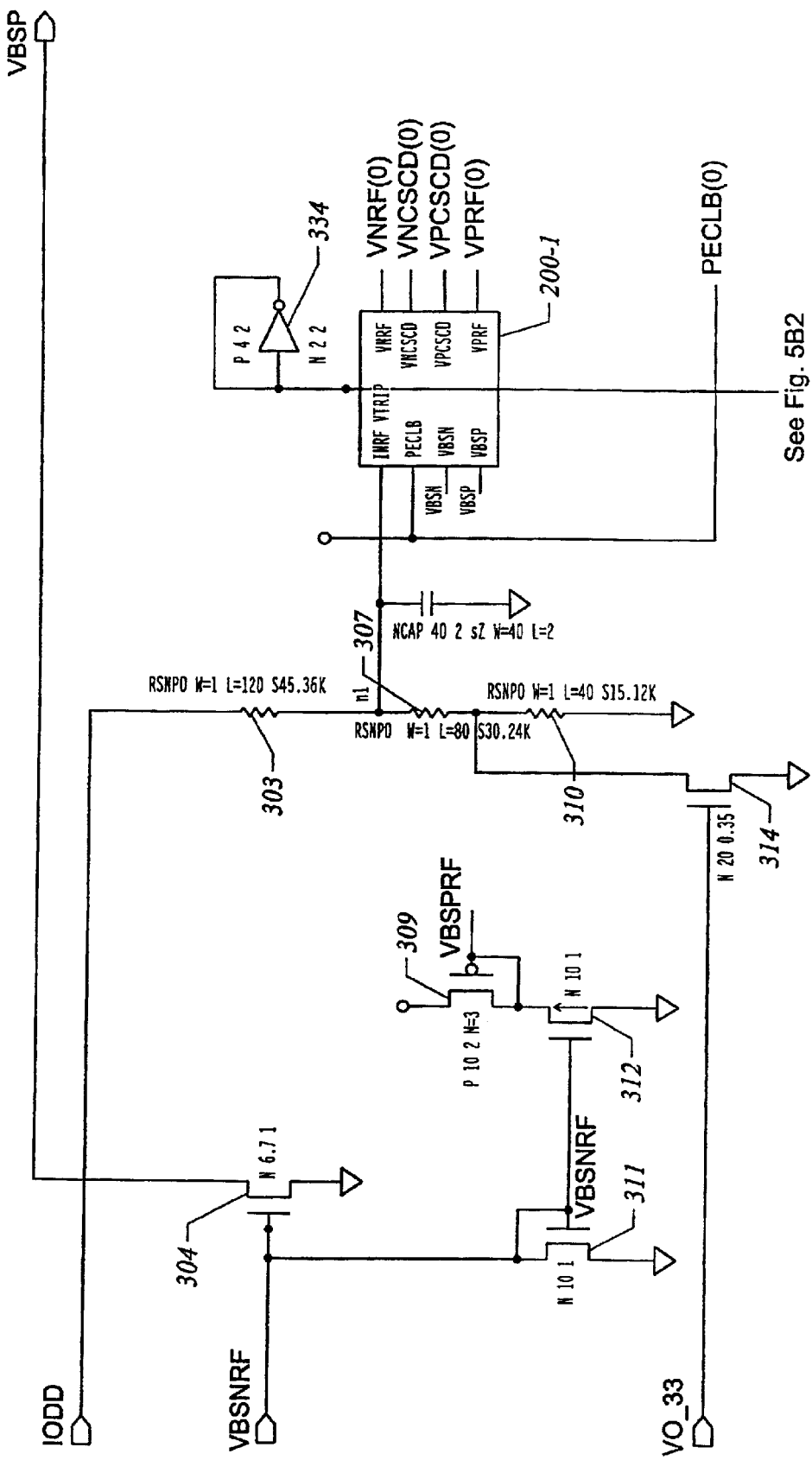
FIG. 5B1

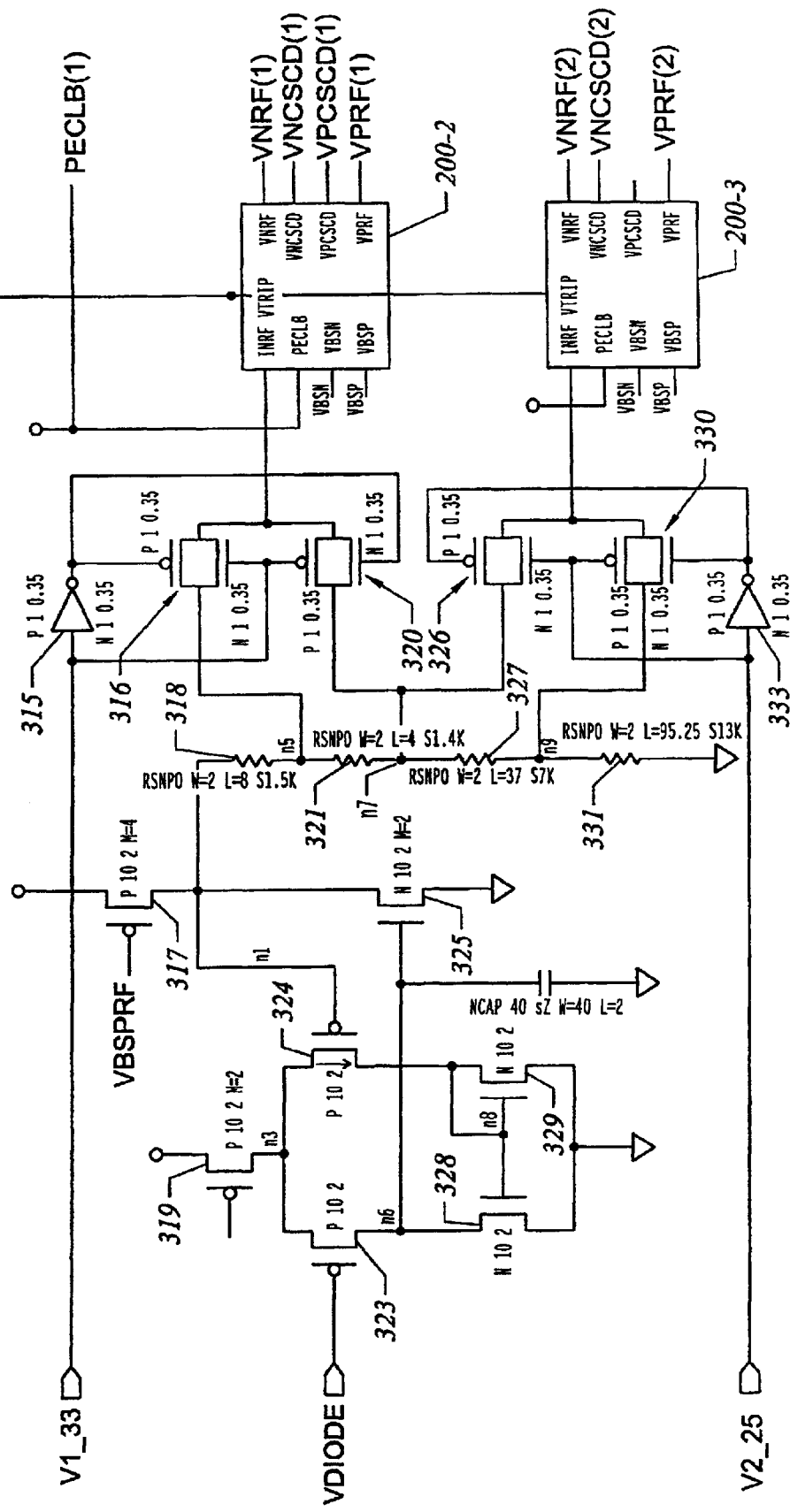
FIG. 5B2

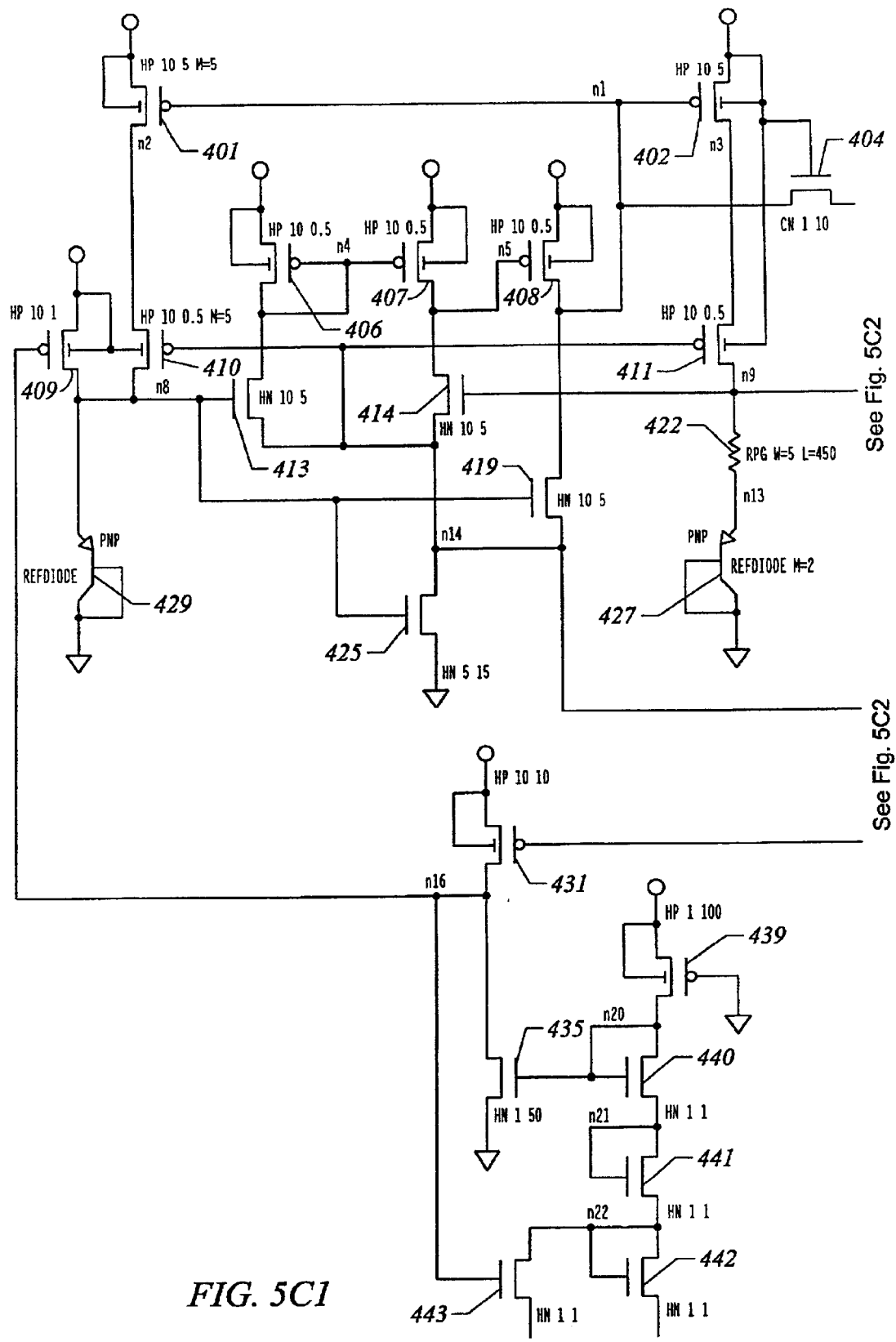
FIG. 5C1

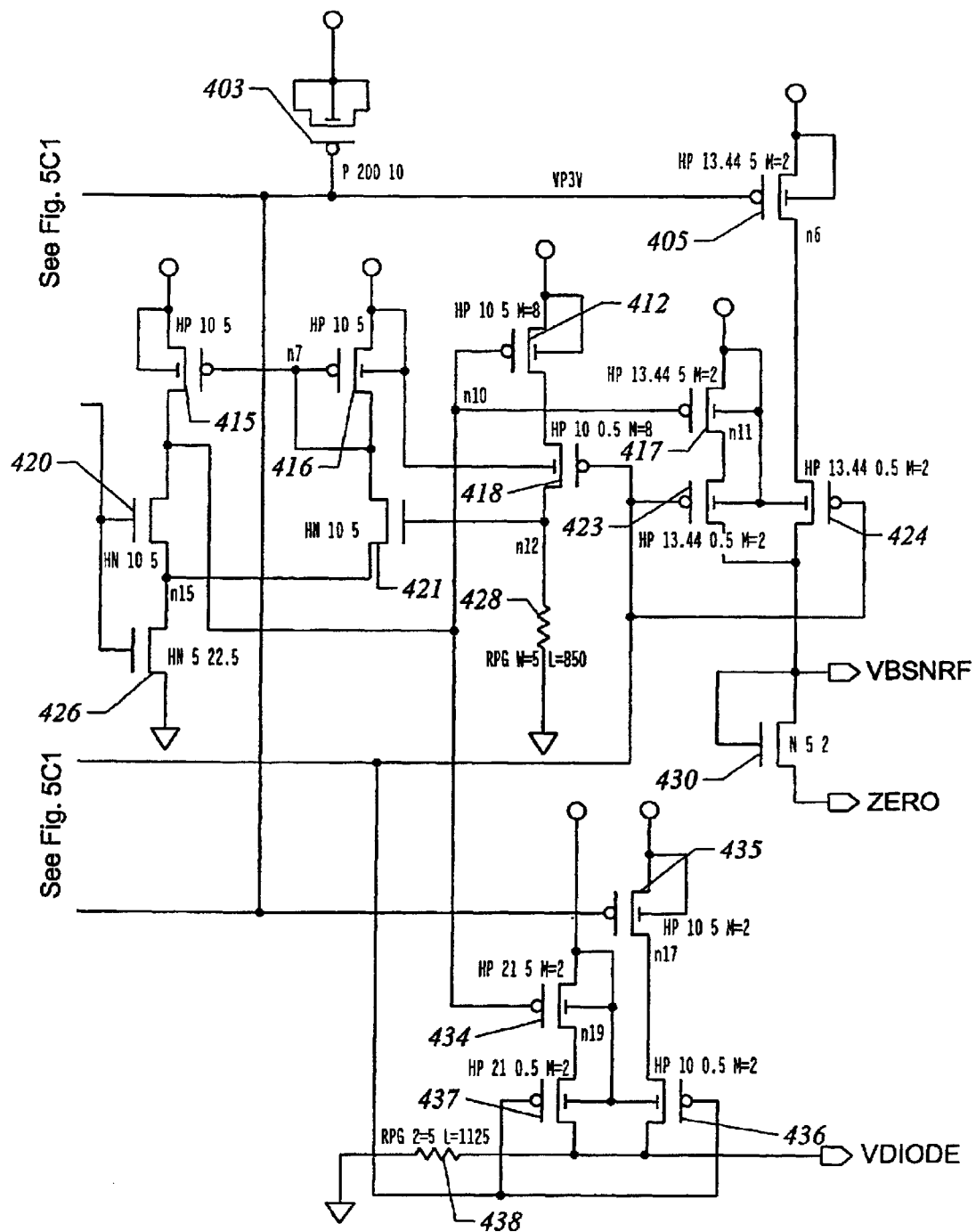
FIG. 5C2

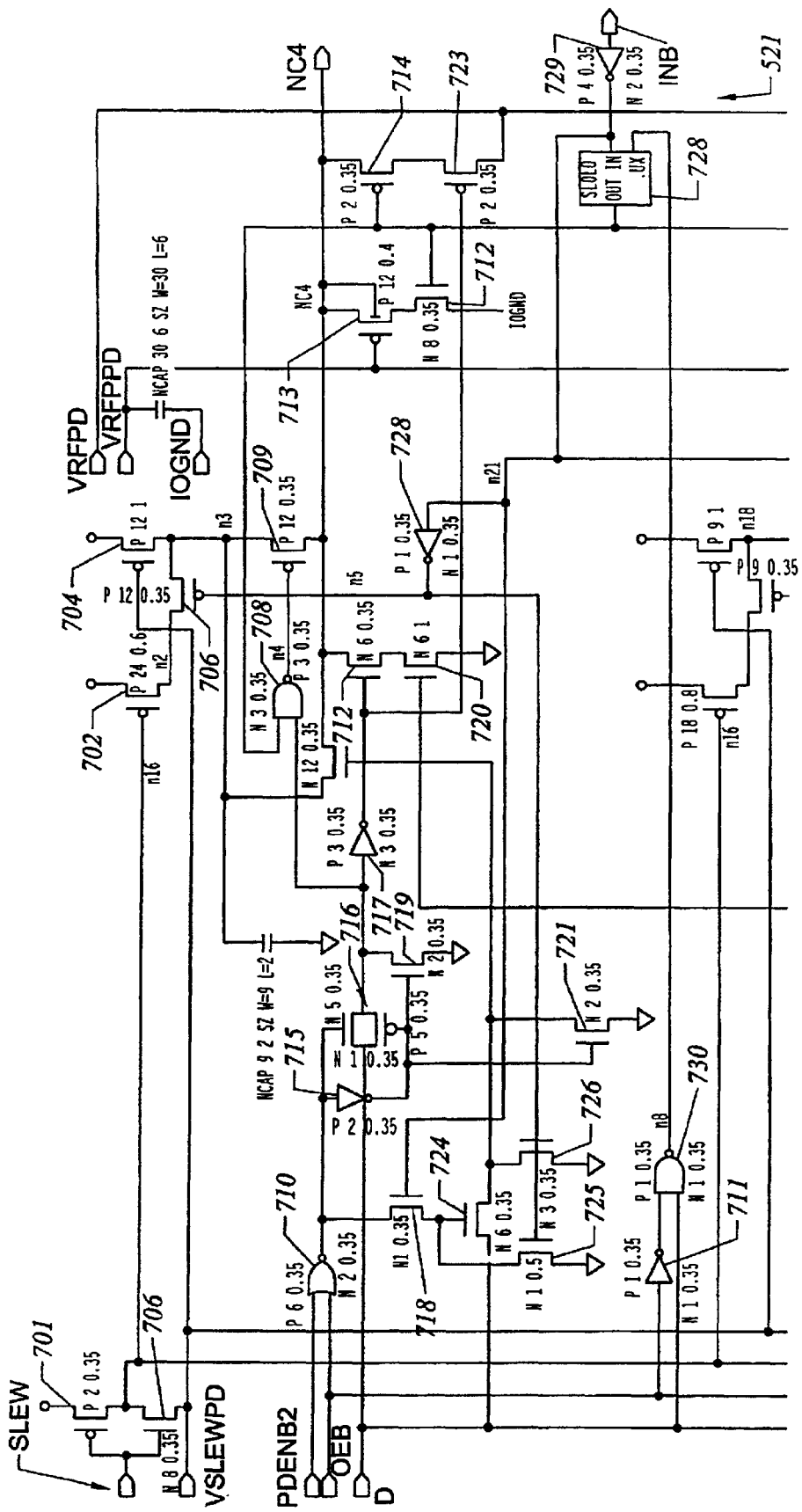
FIG. 7A1

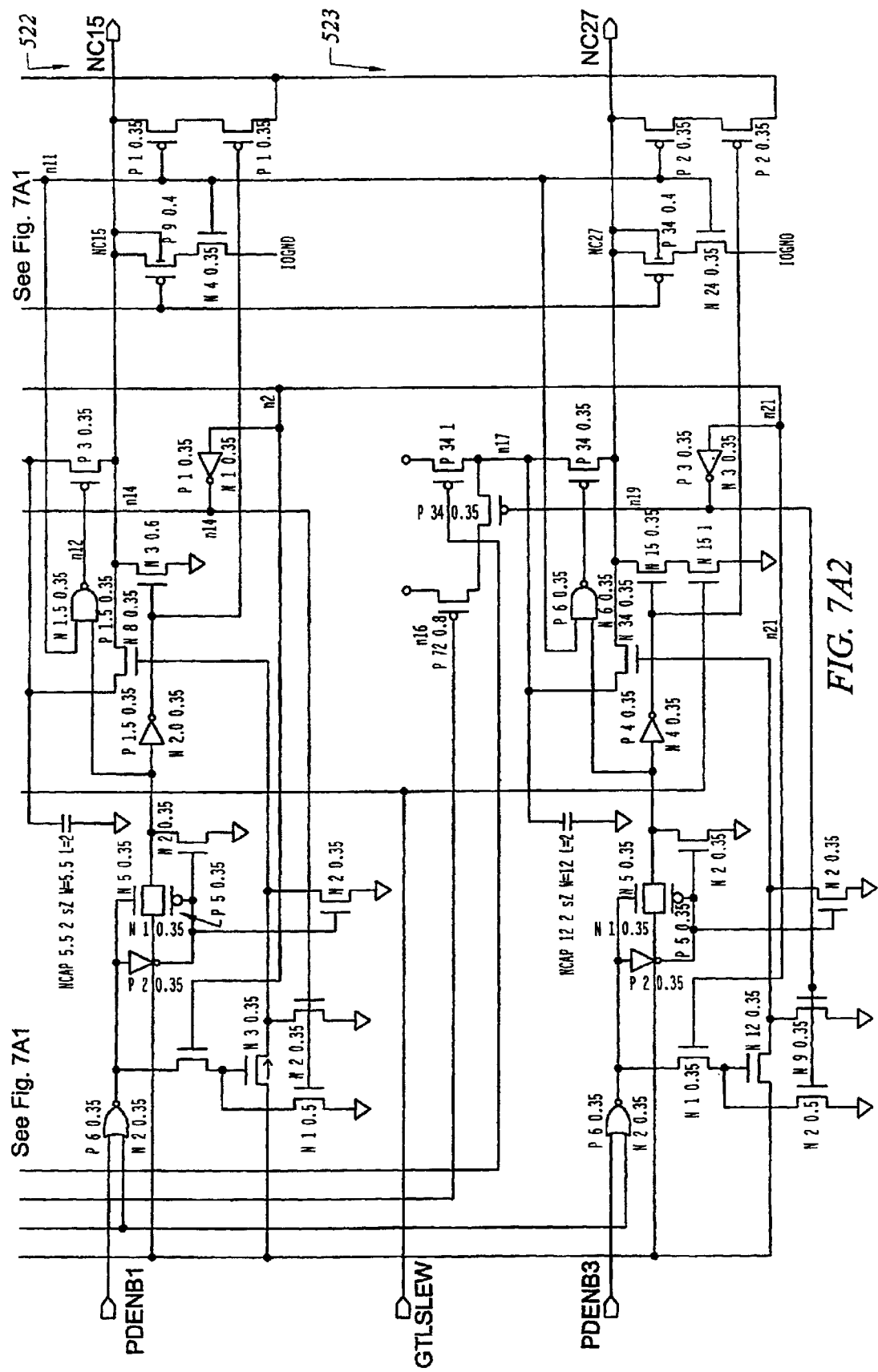
FIG. 7A2

OUTPUT BUFFER WITH OVERVOLTAGE PROTECTION

CROSS-REFERENCE TO RELATED APPLICATIONS

The present application is related to the following patent applications, each of which is filed the same day as the present application, each of which names the same inventor named in the present application, and each of which is incorporated by reference in its entirety into the present application:

U.S. patent application Ser. No. 10/146,769, filed May 16, 2002, entitled "INPUT BUFFER WITH CMOS DRIVER GATE CURRENT CONTROL ENABLING SELECTABLE PCL, GTL, OR PECL COMPATIBILITY";

U.S. patent application Ser. No. 10/146,734, filed May 16, 2002, entitled "BAND GAP REFERENCE CIRCUIT";

U.S. patent application Ser. No. 10/147,199, filed May 16, 2002, entitled "OUTPUT BUFFER HAVING PROGRAMMABLE DRIVE CURRENT AND OUTPUT VOLTAGE LIMITS";

U.S. patent application Ser. No. 10/147,011, filed May 16, 2002, entitled "ELECTROSTATIC DISCHARGE PROTECTION CIRCUIT";

U.S. patent application Ser. No. 10/146,739, filed May 16, 2002, entitled "INPUT BUFFER WITH SELECTABLE PCL, GTL, OR PECL COMPATIBILITY"; and U.S. patent application Ser. No. 10/146,826, filed May 16, 2002, entitled "OUTPUT BUFFER WITH FEEDBACK FROM AN INPUT BUFFER TO PROVIDE SELECTABLE PCL, GTL, OR PECL COMPATIBILITY".

TECHNICAL FIELD

The present invention relates to an input/output buffer design capable of handling multiple types of signals. More particularly, the present invention relates to an output buffer capable of driving loads for different types of circuitry, such as Peripheral Component Interconnect (PCI) circuitry, Gunnings Transceiver Logic (GTL), Emitter Coupled Logic (ECL), Series Stub Terminated Logic (SSTL), or Pseudo Emitter Coupled Logic (PECL) to desired output levels without damaging internal transistors.

BACKGROUND

Circuits constructed in accordance with standards such as PCI, GTL, ECL, SSTL or PECL each have different high and low state characteristics. Although some of the states for different circuit types will have similar voltage and current requirements, others will be different.

PCI provides a high speed bus interface for PC peripheral I/O and memory and its input and output voltage and current requirements are similar to CMOS. For instance, the high and low voltage states will vary from rail to rail (VDD to VSS), with high impedance low current inputs and outputs.

GTL provides a lower impedance higher current high state, providing a low capacitance output to provide higher speed operation. The transition region for GTL is significantly smaller than for CMOS.

PECL provides a high current low voltage to provide a smaller transition region compared to CMOS to better simulate emitter coupled logic (ECL). The PECL offers a low impedance outputs and a high impedance inputs to be the most suitable choice of logic to drive transmission lines to minimize reflections.

Integrated circuit chips, such as a field programmable gate array (FPGA) chip, or a complex programmable logic device (CPLD), provide functions which may be used in a circuit with components operating with any of the logic types, such as PCI, GTL, ECL, PECL, or SSTL described above. The integrated circuits may operate with low voltage transistors. For instance, 1.8 volt transistors may be used which may be damaged by voltages levels significantly higher than 1.8 volts. It would be desirable to have an input/output buffer for use on a general applicability chip such as a FPGA or CPLD to selectively make the chip compatible with any of these logic types while preventing damage to the chip due to overvoltage situations.

SUMMARY

In accordance with the present invention, an input/output buffer circuit includes an output buffer which can selectively be made compatible with any of a number of logic types, such as PCI, GTL, or PECL, while using small transistors, such as 1.8V or 3.3V without damaging the transistors.

In accordance with the present invention, the output buffer portion of the circuit includes an input signal node (D) where components on the integrated circuit provide an output signal for connecting to external circuits at an output pad (PAD). The signal from the PAD is fed back through an input buffer circuit which can be programmably set to operate in one of a GTL, PECL, or PCI operation modes to provide a signal to a node (INB). The node (INB), then is provided to switches to enable the output buffer to rapidly transition the PAD, and to prepare for subsequent transitions of the PAD after another transition of the input D.

The circuitry of the output buffer further provides necessary drive current to transition a load at a desired rate and to set output voltage limits, while limiting drive current after switching to enable a subsequent rapid output transition. The output buffer includes pull up PMOS transistors with source-drain paths connecting VDD to the PAD. The gates of the pull-up PMOS transistors are driven by switching circuits including numerous PMOS transistors included in a common well with the pull up PMOS transistors.

Components in the switching circuitry are provided to connect the PAD to VSS when the PAD voltage exceeds the power supply voltage VSS. Further, the switching circuitry includes components to connect the common wells of PMOS transistors to VSS when the common well has a charge buildup exceeding exceeds VDD.

BRIEF DESCRIPTION OF THE DRAWINGS

Further details of the present invention are explained with the help of the attached drawings in which:

FIGS. 5A1–2 shows circuitry for providing the voltage reference inputs to the input buffer Circuitry of FIGS. 1–4;

FIGS. 5B1–2 shows circuitry connected to several circuits FIGS. 5A1–2 for selectively providing different input references;

FIGS. 5C1–2 shows a band gap -reference circuit for providing a diode reference to the circuit of FIGS. 5B1–2;

FIGS. 7A1–2 shows a pull down portion of an output buffer in accordance with the present invention.

DETAILED DESCRIPTION

Figure 1:
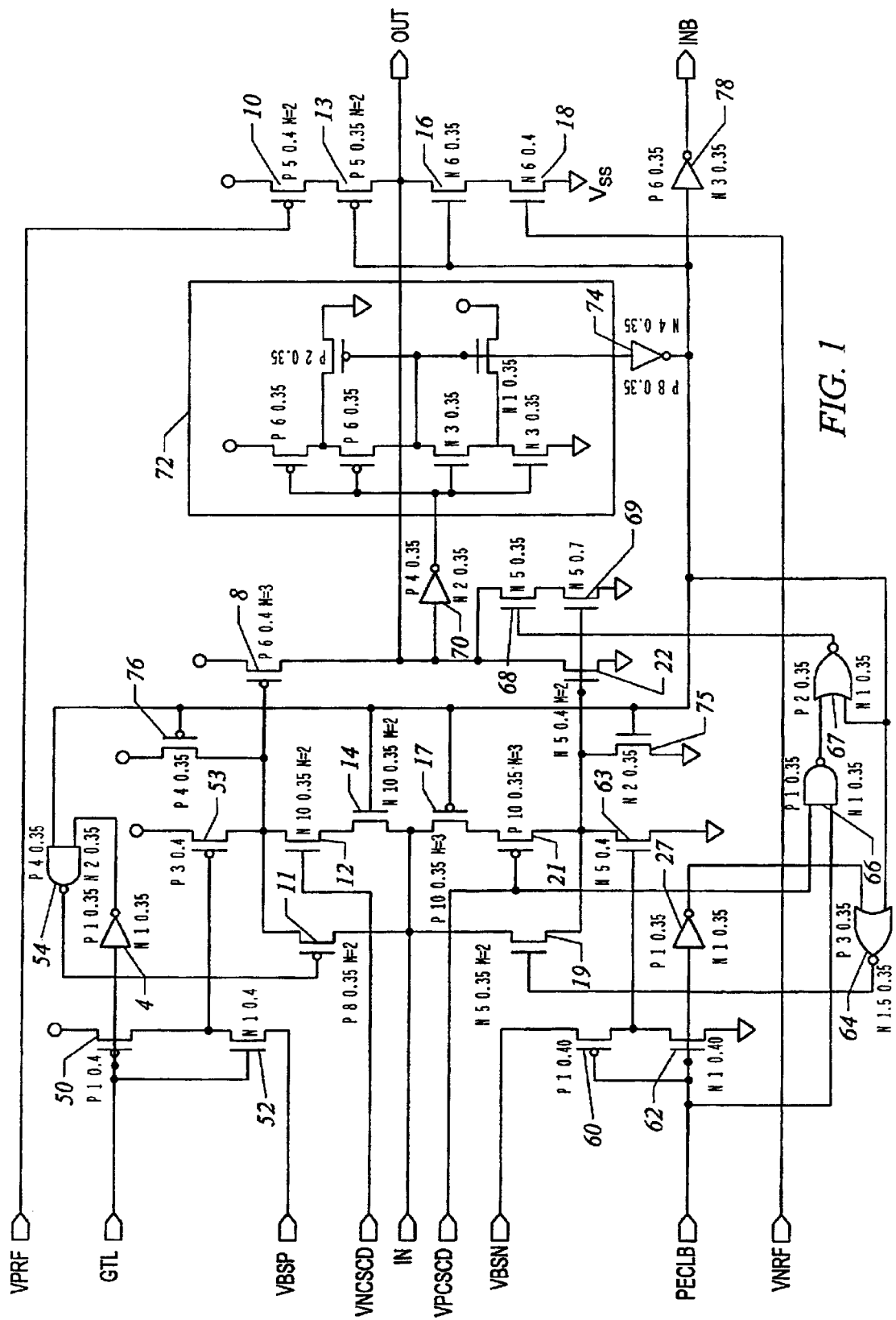
FIG. 1 shows an input portion of an input/output buffer in accordance with the present invention.

As indicated, the input/output buffer in accordance with the present invention includes an input buffer portion as shown in FIG. 1, and an output buffer portion as shown in FIGS. 6 and 7. Further details of the input/output buffer design along with an operation description for the components are provided in sections to follow.

I. Input Buffer

The input buffer in accordance with the present invention is shown in FIG. 1 The circuit of FIG. 1 receives an input signal IN and mode select signals GTL and PECLB nodes, and operates to provide an output signal OUT depending on the input IN, with switching current dependent on mode signals GTL and PECLB states.

The circuit of FIG. 1 includes pull up pass transistors 8 and 13 for connecting the input buffer to the output OUT. The circuit further includes pull down pass transistors 22 and 16 for connecting the input buffer to the output OUT. An input signal is applied to the input buffer at input node IN. Mode select signals are applied at GTL and PECLB nodes to control switching circuitry to set whether the input node IN drives transistors 8 and 22 alone to switch the voltage and current on the output, OUT, or whether transistors are used to assist transistors 8 and 22 to increase switching current and voltage.

In FIG. 1, as well as subsequent figures, transistors with the gate circle, such as the transistors 8 and 13, are PMOS devices, while transistors without the gate circle, such as the transistor 16 are NMOS devices. Further, the transistor device type is indicated by a P or N followed by the transistor length and width in microns. An indicator m=5 next to a transistors indicates that 5 transistors of the same size are connected in parallel. Although specific transistor sizes are shown, other sizes may be utilized depending on specific user design requirements.

The GTL and PECLB mode select nodes are preferably connected to memory cells. The memory cells can then be programmed to control the desired operation mode of the cells. Alternatively, the GTL and PECLB signals can be controlled by logic, or voltages applied external to the input buffer by a user.

The pull up transistor 8 has a source-drain path directly connecting power supply terminal or node VDD to the output OUT, and the pull down transistor 22 has a source-drain path directly connecting power supply terminal or node VSS to the output OUT. The input IN can be applied to control transistors 8 and 22 alone to maximize the range of current or voltage on the output OUT.

The pull up transistor 13 has a source-drain path connected in series with transistor 10 to connect VDD to the output node OUT. The gate of transistor 10 is coupled to a PMOS reference voltage terminal VPRF which limits the voltage and current provided to the output OUT from transistor 13. Similarly, the pull down transistor 16 has a source-drain path connected in series with transistor 18 to connect VSS to the output OUT. The gate of transistor 18 is connected to an NMOS reference voltage terminal VNRF which limits the voltage and current provided to the output OUT through transistor 16.

A. Input Buffer

The GTL and PECL signals can be varied for the circuitry of FIG. 1 to create at least three operation modes, a PCI mode, a GTL mode, and a PECL mode. Components of FIG. 1 and operation with these modes is described in sections to follow.

1. PCI Mode

Figure 2:
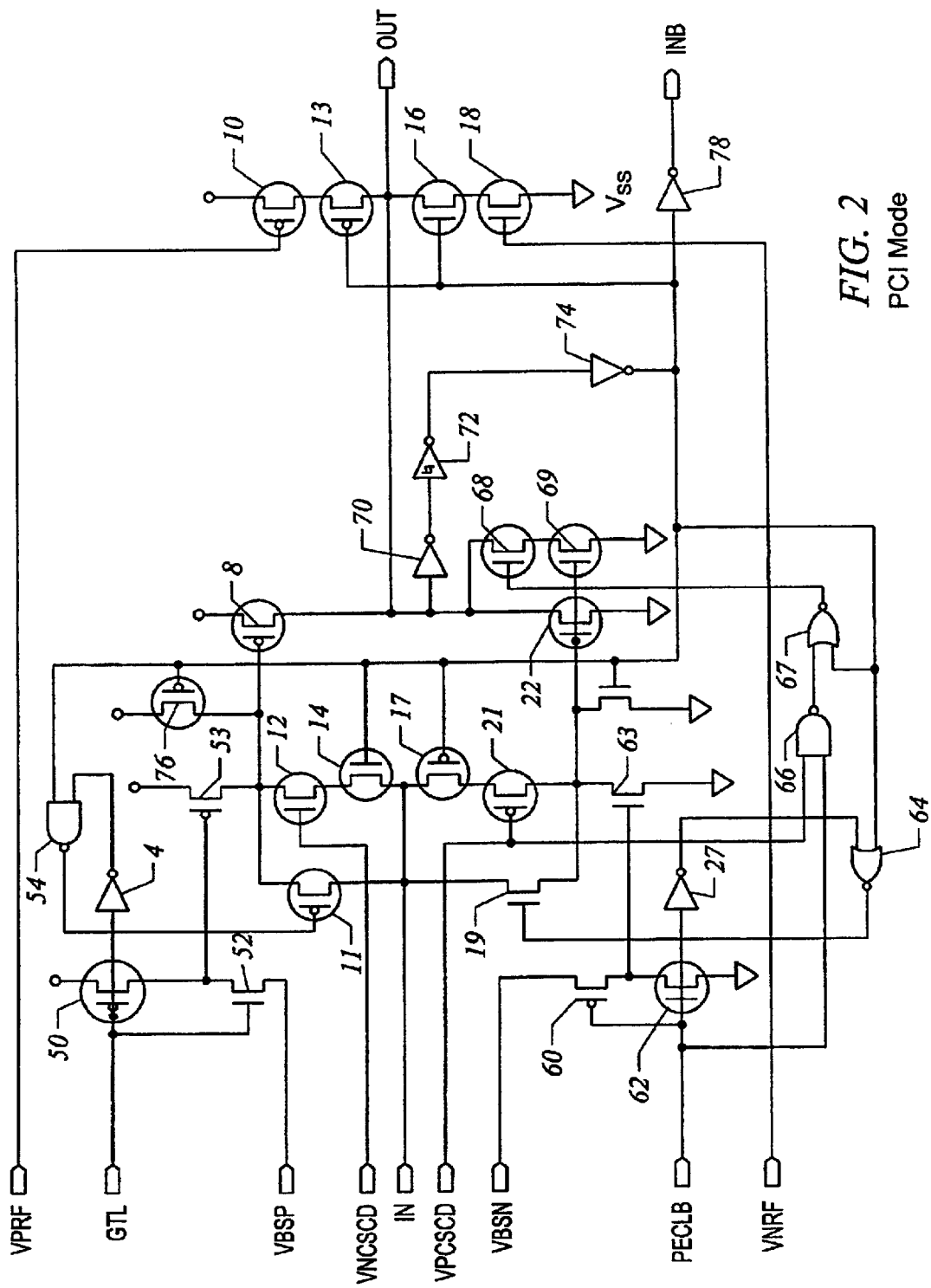
FIG. 2 shows active transistors from FIG. 1 in a PCI mode.

The PCI mode is selected when GTL is low and PECLB is high. FIG. 2 shows the active transistors in the PCI mode. Transistors carried over from FIG. 1 to FIG. 2 are similarly labeled, as will be components carried over in subsequent figures.

With GTL low, transistor 52 turns off and transistor 50 turns on to pull the gate of transistor 53 high. Transistor 53 will, thus, be off. With PECL high, transistor 60 turns off and transistor 62 turns on to pull the gate of transistor 63 high. Transistor 63 will, thus, be off.

With GTL low, the output of inverter 4 will provide a high signal to the input of NAND gate 54. The second input of the NAND gate 54 is connected to node n16 which holds the previous state of the input IN for a short time after any transition of the input IN. The node n16 will transition after a change in the input signal IN drives the output OUT to transition, and inverters 70, 74 and Schmitt trigger 72 transition. The Schmitt trigger has a hysteresis set as desired to assure the output signal is squared. Since the first input to the NAND gate is high, or a 1 with inverter 4 output high, the NAND gate 54 effectively provides a delayed signal IN on node n16 to the gate of transistor 11. Transistor 11 will, thus be on to connect the signal IN directly to the gate of transistor 8 when IN is high, and during a high to low transition of IN.

Transistor 14 which has a gate connected to node n16, will, like transistor 11, likewise be on when IN is high and during a high to low transition of IN, enabling IN to further be connected to the gate of transistor 8 through transistors 12 and 14. With IN directly driving transistor 8, through transistor 11, and transistors 12 and 14, a high to low transition will more rapidly increase current from the drain of transistor B, than with a connection of IN through transistors 14 and 12 alone. During a low to high transition of IN, transistors 11 and 14 will both be off and the gate of transistor 8 will remain low until node n16 is later transitioned to turn on transistor 76, a condition creating a high impedance input.

With PECL high, the output of inverter 27 will provide a low signal to the input of NOR gate 64. The second input of the NOR gate 64 is connected to node n16 which provides a delayed state of the input IN. Since the first input to the NOR gate is low, or a 0, the NOR gate 64 effectively provides the inverse of delayed state of IN from node 16 to the gate of transistor 19. Transistor 19 will, thus be on to connect the signal IN directly to the gate of transistor 8 when IN is low, and during a low to high transition of IN. Transistor 17, which has a gate connected to node n16, will likewise be on when IN is low and during a low to high transition, since n16 will be low, enabling IN to further be connected to the gate of transistor 22 through transistors 17 and 21.

With IN directly driving transistor 22, through transistor 19, and transistors 17 and 21, a low to high transition will occur more rapidly with more current flowing, than with a connection of IN through transistors 17 and 21 alone. During a high to low transition of IN, transistors 19 and 17 will both be off and the gate of transistor 22 will remain low until node n16 is later transitioned to turn on transistor 22, a condition creating a high impedance input.

With PCL high, also a first input to NAND gate 66 will be high. With a second input of NAND gate 66 provided from the VPC reference, its output will be low, making a first input to NOR gate 67 low. The second input to NOR gate 67 is connected to node n16, so the output of NOR gate 67 will be active to provide the inverse of a delayed state of IN from node 16 to the gate of transistor 68. NOR gates 64 and 67 will, thus, act together during a low to high transition so that transistor 19 will be on to drive the gate of both transistors 22 and 69 which will act in parallel to sink additional current to rapidly pull down the output OUT. During a high to low transition of the input IN, the NOR gate 67 will provide a low output turning transistor 19 off, and transistor 22 will act without the assistance of transistor 69.

Thus, in the PCI mode during low to high transitions of the input IN, the input IN is applied to the transistor 8 both through switching transistor 11 and cascode transistor 12 to maximize pull up current. During a low to high transition of the input IN, IN is further applied to the transistor 22 through switching transistor 19 and cascode transistor 21 to maximize pull down current. After transition of the inverter formed by transistors 8 and 22, inverters 70 and 74 and Schmitt Trigger 72 will transition to turn off respective transistors 8 and 22 driving the output OUT current, and turn on respective transistors 13 and 16 to maintain the output OUT signal state.

2. GTL Mode

Figure 3:
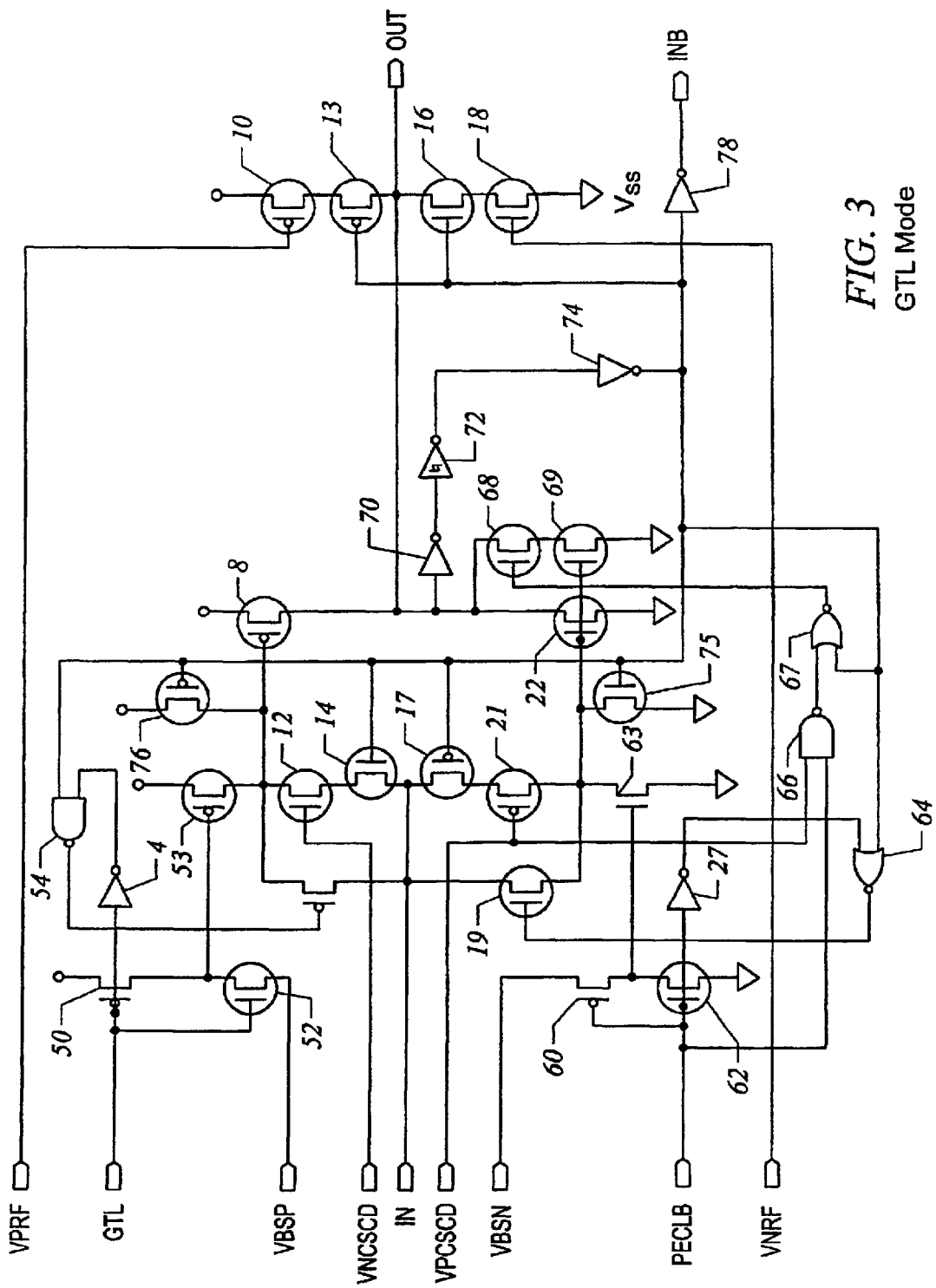
FIG. 3 shows active transistors from FIG. 1 in a GTL mode.

The GTL mode is selected when GTL and PECL are both high. FIG. 3 shows the active transistors in GTL mode.

With PECL high, as in the PCI mode, transistor 60 will be off, and transistor 62 on to turn off transistor 63. Further, the inverter 27 will provide a low output to activate NOR gate 64 and transistor 19 when IN is low and during low to high transitions of IN, as in the PCI mode. Transistors 17 and 21 will further be active to connect the gate of transistor 22 to the input IN when IN is low and during low to high transitions of IN. Similarly, AND gate 66 and NOR gate 67 will activate transistor 68 so that transistors 22 and 69 act together to pull down the output OUT on low to high transitions of IN, as in the PCI mode.

With GTL high, unlike in the PCI mode, transistor 50 turns off and transistor 52 turns on to pull the gate of transistor 53 low. Transistor 53 will, thus, be off. With GTL high, the output of inverter 4 will provide a low signal to the input of NAND gate 54. Irrespective of the second input to NAND gate 54, its output will be high. Transistor 11, will thus be off at all times in the GTL mode. Transistor 14, which has a gate connected to node n16, will be on when IN is high and during a high to low transition of IN, since n16 will be high. With transistor 14 on, the input IN is connected to the gate of transistor 8 through transistors 12 and 14. Current for the transition of IN from high to low initially driving transistor 8 will be somewhat weakened with transistor 11 turned off and only transistors 12 and 14 operative in the GTL mode relative to the PCI mode.

During a low to high transition of the input IN, n16 will be low, turning off transistor 14, effectively cutting off any path from the input IN to the gate of transistor 8. Prior to the low to high transition, with IN low, node n16 will be low turning on transistor 76 to pull up the gate of transistor 8 to turn it off, since any path from the gate of transistor 8 to IN is cut off. Transistor 53 will hold the gate of transistor 8 high after n16 resets to turn transistor 76 off. After the input IN switches to high, n16 will go high turning on transistors 12 and 14 to enable the input IN to keep transistor B turned off. Thus, during the low state of IN, and a transition of IN from low to high, the output OUT is held high by the lower GTL voltage and current of transistors 10 and 13, as opposed to the voltage and current created in the PCI mode with transistor 8 on.

Thus, in the GTL mode transistor 22 of the inverter formed by transistors 8 and 22 functions to pull down the output OUT when IN transitions from low to high. After the transition of IN to high, transistor 22 will turn off, and the output will be held low by transistors 16 and 18. But, transistors 10 and 13 function to drive the output OUT when the input IN transitions from high to low without the stronger voltage and current of transistor 8.

3. PECL Mode

Figure 4:
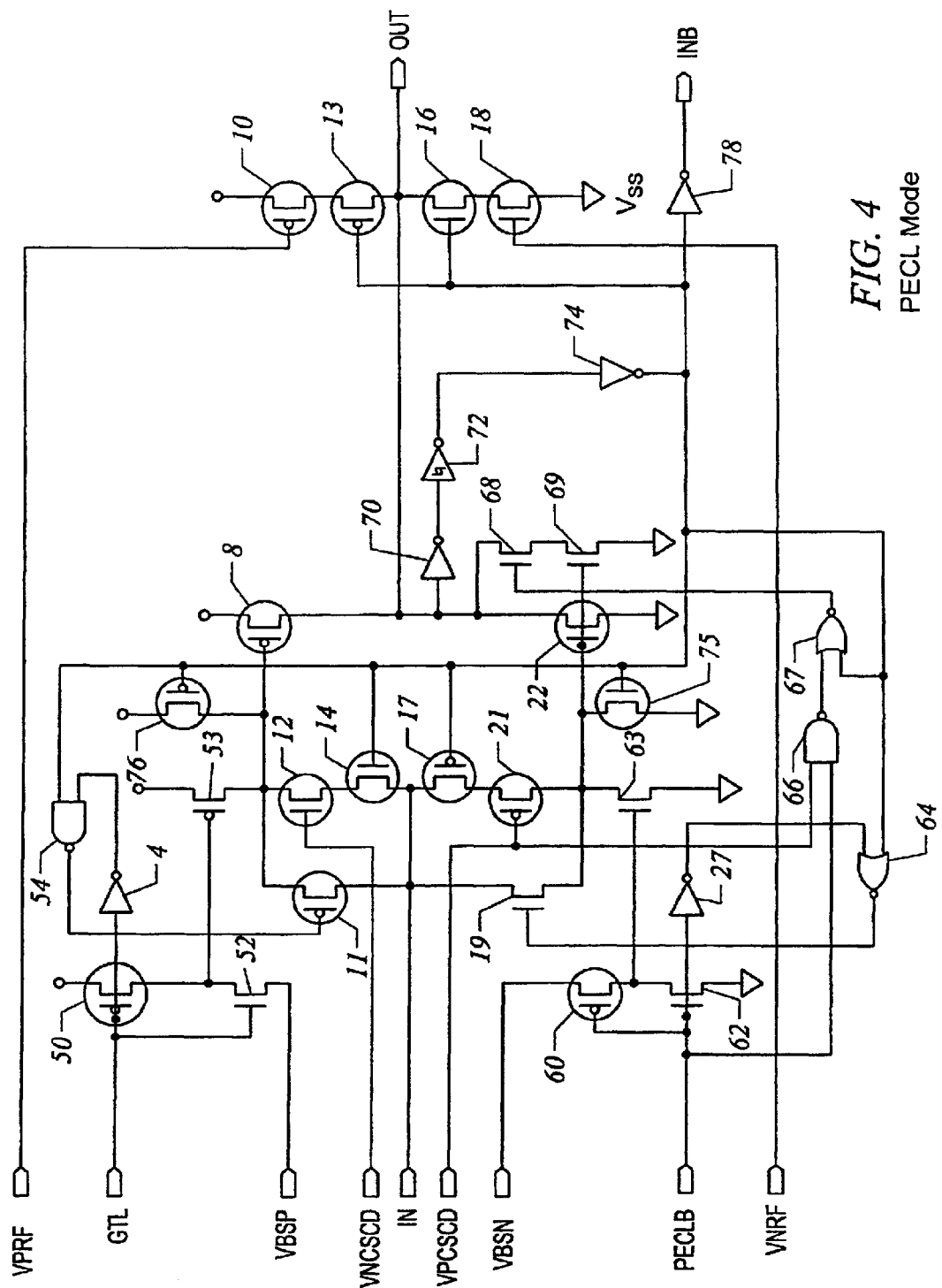
FIG. 4 shows active transistors from FIG. 1 in a PECL mode.
Figure 6A:
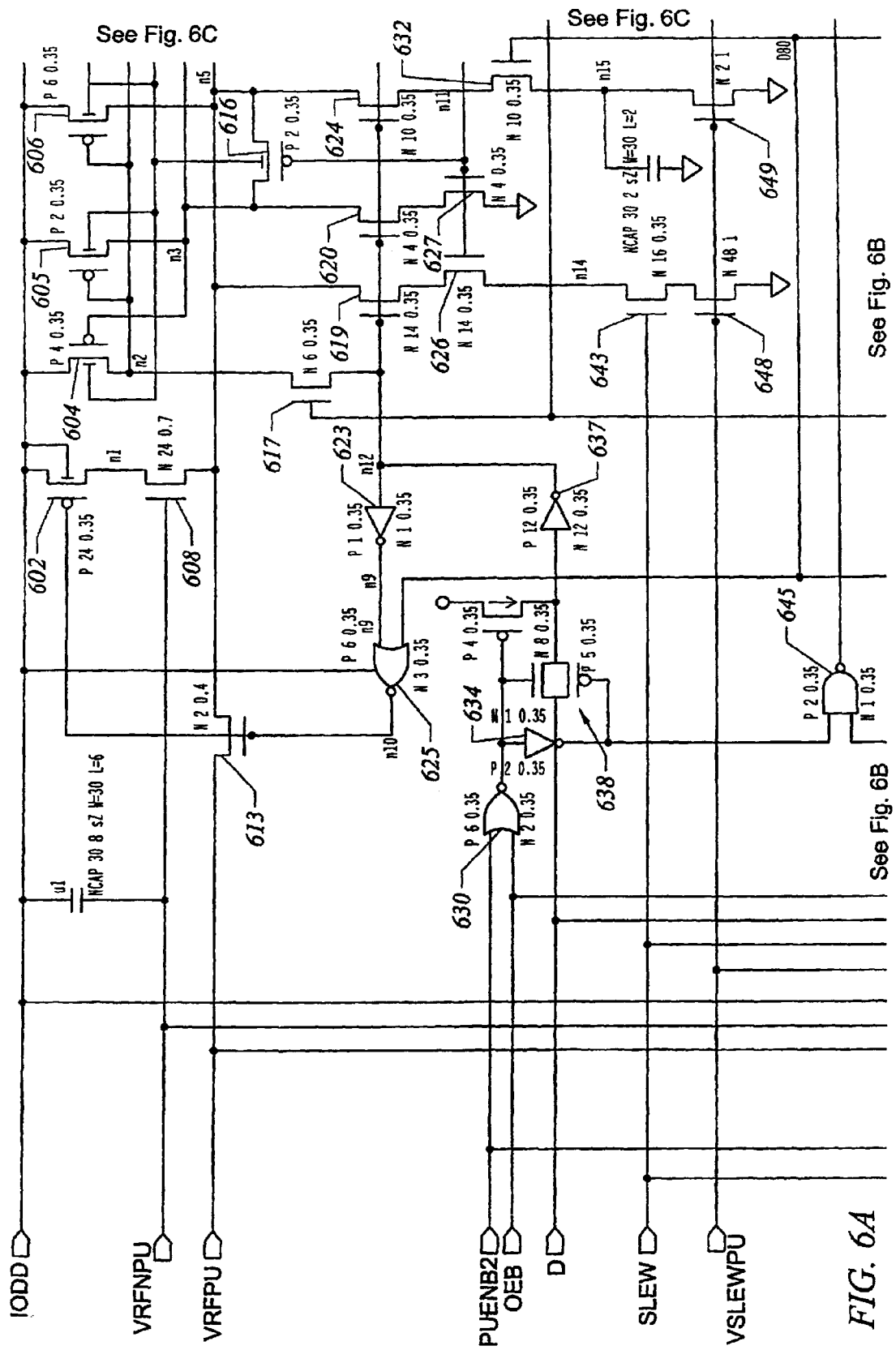
FIGS. 6A–D shows a pull up portion of an output buffer in accordance with the present invention.
Figure 6B:
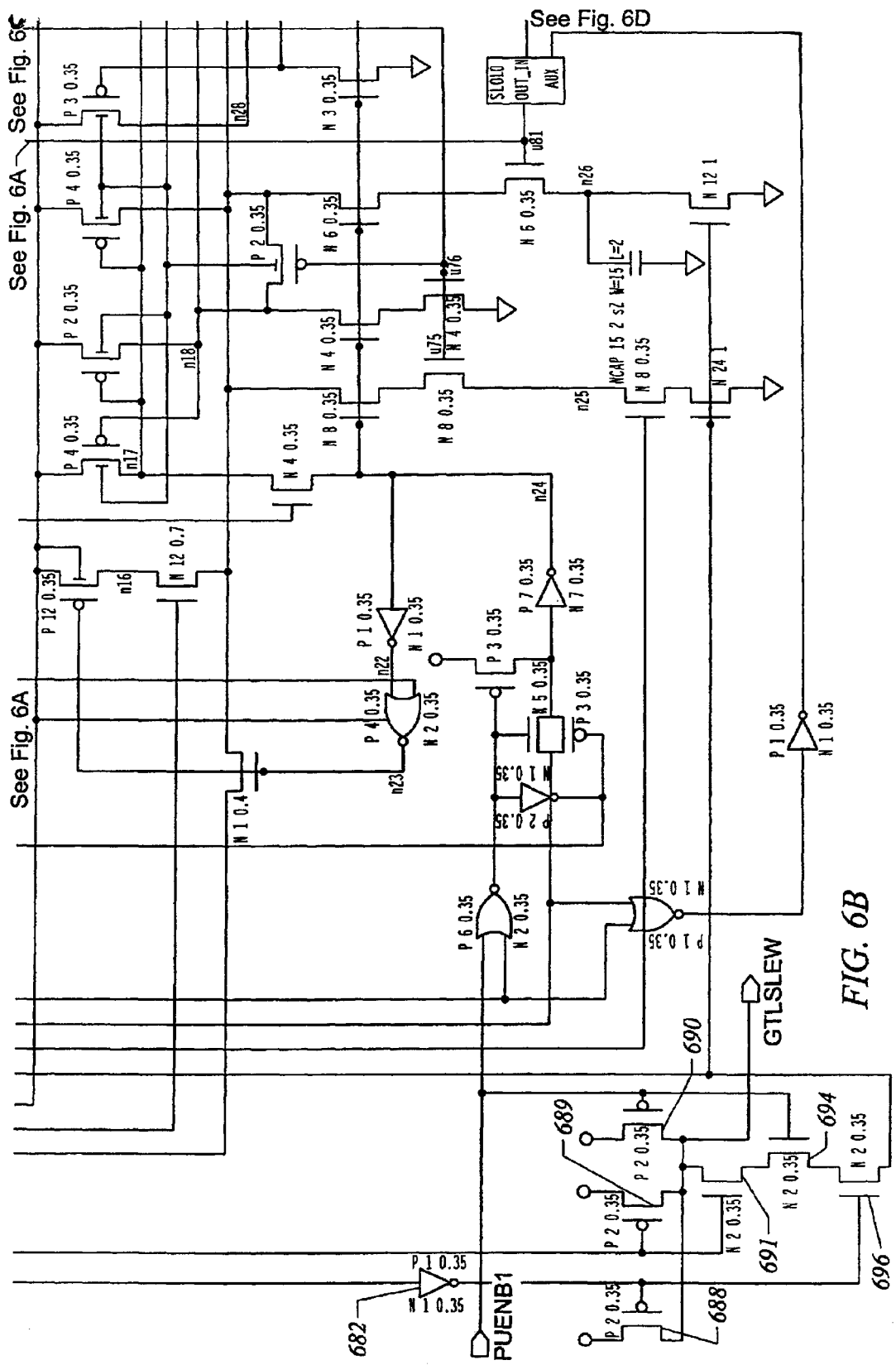
Figure 6C:
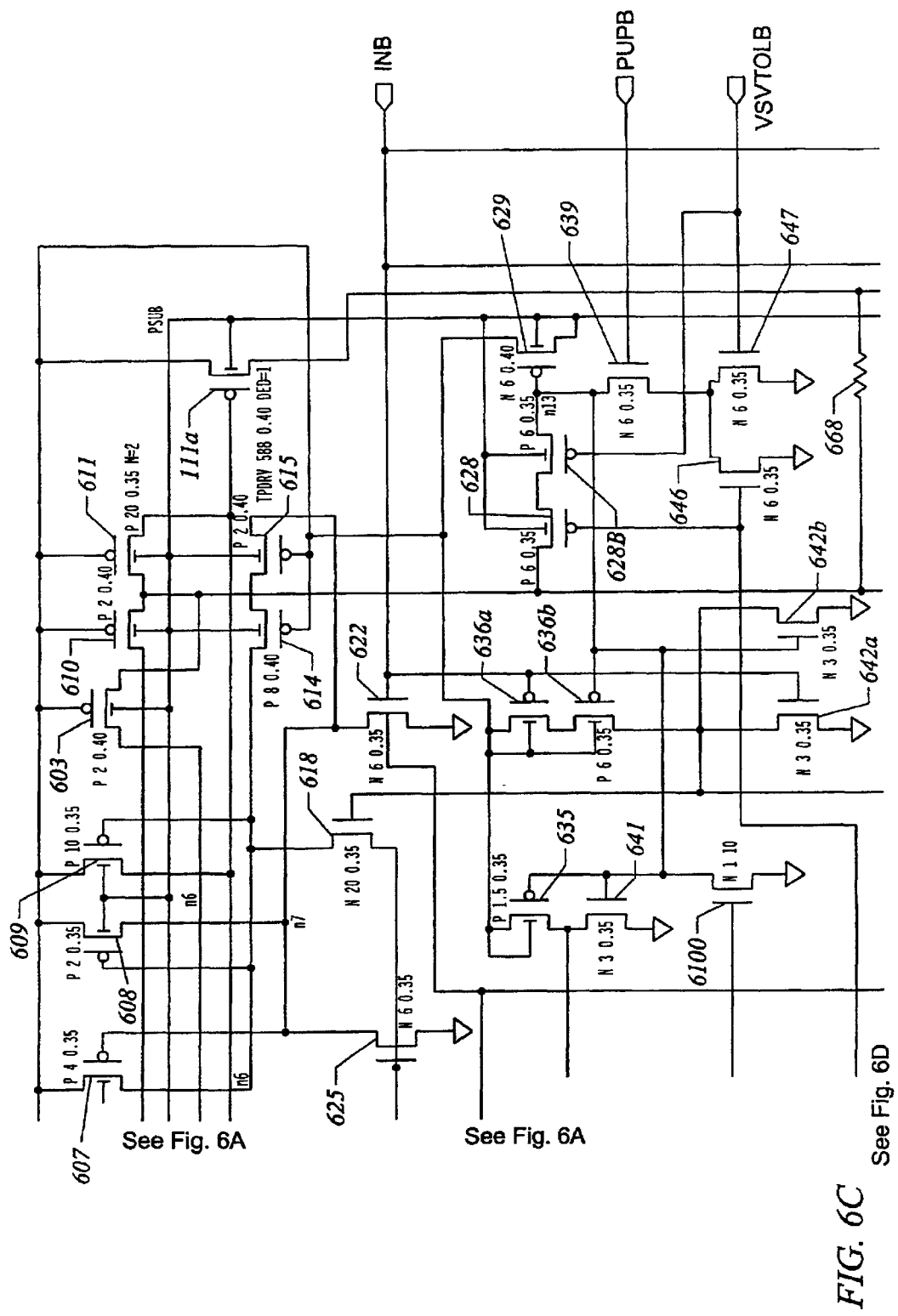
Figure 6D:
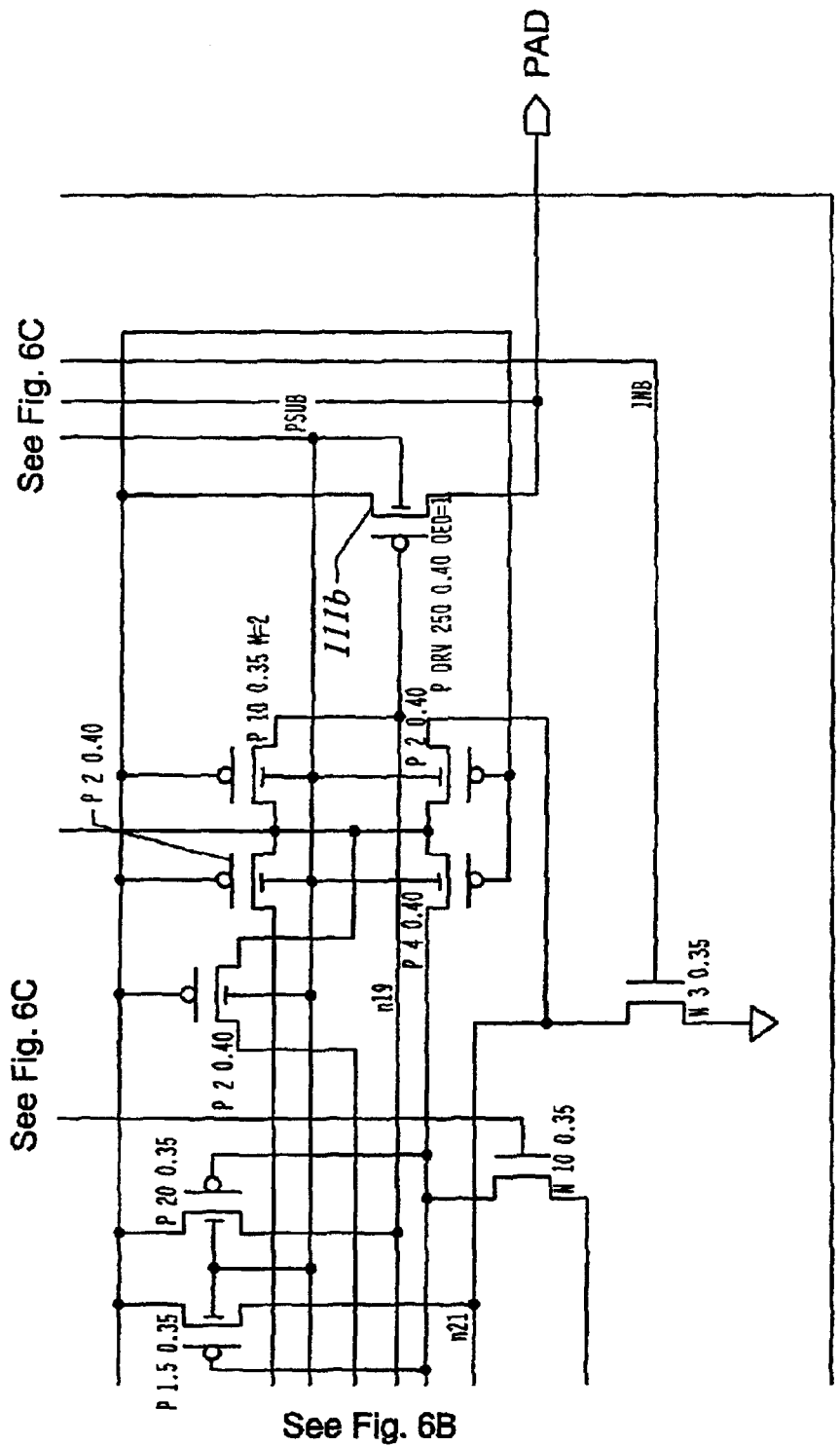

PECL mode is selected when GTL and PECL are both low. FIG. 4 shows the active transistors in PECL mode. As with the PCI mode and unlike the GTL mode, with GTL low, transistor 50 will be on, and transistor 52 on to turn off transistor 53. Further, as in the PCI mode, the inverter 4 will provide a high output to activate NAND gate 64 and transistor 11 during high to low transitions of IN. Transistors 14 and 12 will further be active to connect the gate of transistor 8 to the input IN during high to low transitions of IN.

With PECL low, unlike either the PCI or GTL modes, transistor 60 turns on and transistor 62 turns off to pull the gate of transistor 63 high. Transistor 63 will, thus, be on. With PECL low, the output of inverter 27 will provide a high signal to the input of NOR gate 64. Irrespective of the second input to NOR gate 64, its output will be low. Transistor 19, will thus be off at all times in the PECL mode.

Transistor 17, which has a gate connected to node n16, will be on when IN is low, and during a low to high transition of IN, since n16 will be low. With transistor 17 on, the input IN is connected to the gate of transistor 21 through transistors 17 and 21. Current for the transition of IN from low to high driving transistor 22 will be somewhat weakened with transistor 19 turned off and only transistors 12 and 14 operative in the GTL mode relative to the PCI mode.

During a high to low transition of IN, n16 will be high, turning off transistor 17, effectively cutting off any path from the input IN to the gate of transistor 22. Prior to the high to low transition, with IN high, node n16 will be high turning on transistor 75 to pull down the gate of transistor 22 to turn it off, since any path from the gate of transistor 22 to IN is cut off. Transistor 63 will hold the gate of transistor 22 low after n16 resets to turn transistor 76 off. After the input IN switches to low, n16 will go low turning on transistors 17 and 22 to enable the input IN to keep transistor 22 turned off. Thus, during the high state of IN, and a transition of IN from high to low, the output OUT is held low by the higher PECL voltage and current of transistors 16 and 18, as opposed to the voltage and current created in the PCI and GTL modes with transistor 22 on.

With PECL low, a first input to NAND gate 66 will be low, assuring the output of the NAND gate 66 will be high.

With one high input from the output of NAND gate 66, NOR gate 67 will have a low output to turn off transistor 68. With transistor 68 off, transistor 69 will also be off.

Thus, in the PECL mode transistor 8 of the inverter formed by transistors 8 and 22 functions to pull up the output OUT when IN transitions from high to low. After the transition of IN to low, transistor 8 will turn off, and the output will be held low by transistors 16 and 18. But, transistors 16 and 18 function to drive the output OUT when the input IN transitions from high to low without the stronger pull down current and lower voltage of transistor 22.

B. Reference For Input Buffer

1. FIG. 5A References To Input Buffer

FIGS. 5A–5C show circuitry for providing the reference voltages VNCSCD, VPRF, VNRF and VPCSCD for the input buffer circuits shown in FIGS. 1–4. The circuit of FIG. 5A provides the signals VNCSCD, VPRF, VNRF and VPCSCD, while the circuit of FIG. 5B provides input signals to the circuit of FIG. 5A and enables a programmable selection of power supply voltage levels of 1.8V, 2.5V and 3.3V. The circuit of FIG. 5C provides references to the circuit of FIG. 5B.

FIG. 5A receives the references VBSP, INRF, PECLB, GTL and VBSN. The reference VBSP is a minimum PMOS diode voltage to enable an PMOS transistor to provide a 1 vt drop from VDD. Similarly the reference VBSN is a minimum NMOS diode voltage to enable an NMOS transistor to turn on to provide a NMOS diode voltage above VSS at its drain. The mode select signal PECLB is set to low to indicate when the input buffer is PECL compatible, and otherwise is set to high. The mode select signal GTL is set to high to indicate when the input buffer is GTL compatible, and otherwise is set to low. The reference INRF is a voltage reference set to generate a precise output voltage level 1.8V, 2.5V or 3.3V level. The reference VTRIP is further provided which is simply an inverter with its input and output connected to provide a constant refresh.

The voltage VBSP is provided to the gates of PMOS transistors 201, 202 and 203. Transistor 203 then provides a current source from VDD to a current mirror amplifier made up of PMOS transistors 208 and 209 and NMOS transistors 215 and 216, all having the same size. Transistors 215 and 216 are connected as a current mirror with common gates connected to the drain of transistor 216, and common sources connected to VSS. Transistor 208 is connected from the current source u4 to the drain of 215, while transistor 209 is connected from the current source 203 to the drain of transistor 216. Transistors 208 and 215, then drive the same current as transistors 209 and 216. The drain of transistor 208 at node n4 is connected to the gate of an NMOS transistor 211. Transistor u11 has a source-drain path connecting the gate of transistor 209 to ground. A similar set of transistors 323, 324, 328, 329 and 325 is provided in FIG. 5B with the gate of transistor 324 driving resistors 218, 221, 227 and 231 to provide a selectable voltage reference for INRF. Accordingly, with INRF applied to the gate of 208 in FIG. 5A, the gate of transistor 209 of FIG. 5A (node n3) will mimic the voltage INRF. The current mirror formed by transistors 206, 207, u11 and 212, then serves to buffer the reference INRF from the circuit of FIG. 5B.

The reference VNCSCD is applied to the gate of transistor 14 of FIGS. 1–4 to assure a voltage is applied to the gate of transistor 8 to create a GTL high during a low to high transition of the output OUT by transistor 8. Transistors 508, 505 and 507 in FIG. 5A replicate respective transistors 53, 12 and 14 of FIGS. 1–4. The voltage on node n3 will replicate the desired level for a high IN in the GTL mode. The voltage on node n3 assures the voltage passed by cascode transistor 14 is at a desired level to generate a GTL high from transistor 8 at the output OUT.

In the GTL mode transistor 204 will be disabled by a high GTL signal while transistor 207 is enabled. If the GTL mode is not selected, 207 will be turned off, and VNCSCD will charge up to VDD. If the GTL mode is not selected, transistor 204 will be on to pull node n3 to VDD instead of the INRF reference voltage.

The reference VPRF is applied to the gate of transistor 10 in FIGS. 1–4 to turn on transistor 10 to a desired level below VDD to provide a desired GTL high voltage level at the output. The voltage INRF applied to the gate of transistor 223 is a high input designed to apply to the gate of an NMOS transistor to create an NMOS drain voltage of VPRF used to drive the PMOS transistor 10 in FIGS. 1–4 appropriately. The drain of transistor 223 is then applied to a buffering current mirror amplifier made of transistors 210, 221, 222, 224 and 225. The output node n11 then provides VPRF to the gate of transistor which connects VDD to the source of PMOS transistor 217 which has a gate connected to ground and a drain connected in common with transistor 223. The transistors 212 and 217 provide replicas of transistors 10 and 13, and INRF assures the voltage at the drain of transistor 223 is at a desired VPRF value. The feedback voltage from node nil to the gate of transistor 212 servos until an appropriate voltage VPRF is reached. With VPRF controlling the gate of both transistors 212 and 10, and transistors 212 and 217 replicating transistors 10 and 13, the voltage at the drain of transistor 13 will be the desired GTL high voltage.

Transistors 219 and 213 are provided with gates connected to receive the mode signal PECLB to disconnect the VPRF voltage from the reference at node n11 and connect VPRF to VDD when PECL mode is desired.

The reference VPCSCD is applied to the gate of transistor 21 of FIGS. 1–4 to assure a voltage is applied to the gate of transistor 22 to create a PECL low during a high to low transition of the output OUT by transistor 22. Transistors 240, 243 and 247 in FIG. 5A replicate respective transistors 17, 21 and 63 of FIGS. 1–4. The voltage INRF at node n3 will replicate the desired level for a high IN in the PECL mode. The voltage at node n3 assures the voltage passed by cascode transistor 17 is at a desired level to generate a PECL low from transistor 22 at the output OUT.

In the PECL mode transistor 239 will be disabled by the low PECLB signal, while transistor 240 is enabled to connect INRF from node n3 through to transistors 243 and 247. If the PECL mode is not selected, 240 will be turned off, and node n3 will be connected to VSS through transistor 246. Transistor 246 has a gate voltage provided from 255 which has a common gate to drain connection to provide a 1 vt level above VSS to minimally turn on transistor 255, as well as transistor 246 and 247.

The reference VNRF is applied to the gate of transistor 18 in FIGS. 1–4 to turn on transistor 18 to a desired level above VSS to provide a desired PECL low voltage level at the output. The voltage INRF applied to the gate of transistor 230 is a low input designed to apply to the gate of a PMOS transistor to create a PMOS drain voltage of VNRF used to drive the NMOS transistor 18 of FIGS. 1–4 appropriately. The drain of transistor 230 is then applied to a buffering current mirror amplifier made of transistors 228, 229, 233, 234 and 238. The output node n12 then provides VNRF to the gate of transistor u36 which connects VSS to the source of NMOS transistor 235 which has a gate connected to ground and a drain connected in common with transistor 230. The transistors 230 and 235 provide replicas of transistors 16 and 18, and INRF assures the voltage at the drain of transistor 230 is at a desired VNRF value. The feedback voltage from node n12 to the gate of transistor 236 servos until an appropriate voltage VNRF is reached. With VNRF controlling the gate of both transistors 236 and 18, and transistors 230 and 235 replicating transistors 16 and 18, the voltage at the drain of transistor 16 will be the desired PECL low voltage.

2. FIG. 5B Selection Of Voltages Driving FIG. 5A Circuits

FIG. 5B shows the connection of three circuits 200-1, 200-2 and 200-3 with components as shown in FIG. 5A. As described with respect to FIG. 5A previously, the circuit of FIG. 5B includes a current mirror amplifier made of transistors 319, 323, 324, 328 and 329 as connected to transistors 325 and 317 to provide different precise selectable reference voltages from resistors 318, 321, 327 and 331. The voltage VDIODE controlling the gate of transistor 323 is provided from a band gap reference illustrated in FIG. 5C. Select voltages V1_33 and V2_25 are applied to set the INRF voltages for the different reference circuits 200-1,2,3. With a high applied to V1_33, pass gates 316 will be on to connect INRF of VREFIN between resistors 318 and 321, while disabling pass transistors 320 to provide a 3.3V reference as INRF to circuit 200-2. With V1_33 low, pass gates 316 will be off and 320 will be on to provide a 2.5 volt reference as INRF to circuit 200-2. With a high applied to V2_25, pass gates 326 will be on to connect INRF of VREFIN between resistors 321 and 327, while disabling pass transistors 320 to provide a 2.5V reference as INRF to circuit 200-3. With V2_25 low, pass gates 326 will be off and 330 will be on to provide a 1.8 volt reference as INRF to circuit 200-3.

The reference INRF connection for reference circuit P200-1 is programmed only for the PCI standard using the input V0_33. With the PCI reference, an accurate diode bandgap reference is not utilized. Instead, series resistors are connected between IODD and VSS. With V0_33 high, transistor u14 will bypass resistor u10 so that a reference of 2.5 volts is provided as INRF. With V0_33 low transistor 314 will be off, so the combination of resistors 307 and 310 will boost the voltage provided to INRF to 3.3 volts.

The circuit of FIG. 5B further generates a voltage reference VBSPRF used in FIG. 5B, as well as the reference VBSP used in FIG. 5A. The reference VBSPRF is generated from a CMOS pair of transistor 309 and 312 with a minimal voltage applied to the gate of NMOS transistor 312, VBSNRF to minimally turn it on to connect to VSS. The drain and gate of PMOS transistor 309 are connected to form the reference VBSPRF to provide a 1 vt drop from VDD when VBSPRF is applied to a PMOS transistor. Transistor 312 has a gate connected in common with the gate and rain of transistor 311 to form a current mirror. The drain of transistor 311 then provides the reference VBSNRF to the gate of an NMOS transistor 316 which has a source connected to VSS. The drain of transistor 316 then provides the reference VBSP.

3. Band Gap Reference Circuit

FIG. 5C shows detailed circuitry for a band gap reference of the present invention. The circuitry shown in FIG. 5C is modified from the circuitry described in U.S. Pat. No. 6,031,365 entitled "Band Gap Reference Using A Low Voltage Power Supply" with inventor Bradley A. Sharpe-Geisler, which is incorporated herein by reference. The band gap reference of FIG. 5C provides a reference voltage VDIODE, as well as a reference current VBSPRF which vary little with changes in temperature or VDD. With components sizes chosen as shown, VDIODE is approximately 1 volt.

The circuit of FIG. 5C includes current source transistors 401, 402 and 405. The current source 405 provides current which is buffered to drive a resistor 438 connected to ground. The resistor provides the voltage VDIODE, while the drain of transistor 405 is provided through transistor 424 to provide a current reference VBSNRF. The current source 402 drives a series resistor 422 and PNP transistor 427. The current source 501 drives a PNP transistor 429. The circuit of FIG. 5 enables only one transistor drop between a power supply VDD and VSS. With only one transistor, VDIODE may range below the 1.2 volts provided by the circuit in U.S. Pat. No. 6,031,365. The lower VDIODE voltage enables a power supply (VDD) as low as 1.3 volts to be used, a voltage now provided in some low voltage circuits.

The circuit of FIG. 5C further includes a current mirror opamp circuit, including transistors 406, 407, 413, 414 and 425. The opamp transistors function to drive nodes n8 and n9 (the − and + inputs of the opamp) to equal values.

In operation it is first assumed that node n8 is above node n9. Transistors 406 and 407 are connected in a current mirror configuration to sink the same current to drive the drains of transistors 413 and 414. With node n8 above n9, transistor 413 will turn on to a greater degree than 414 and node n5 will charge up. With n5 charging up, transistor 408 turns off more. Transistor 419 has a gate connected to the gate of transistor 413 and a source connected to the source of transistor 413 to sink the same current as transistor 413. With transistor 408 turning off more, the voltage on node n1 will drop. With the voltage on node n1 dropping, current sources 401 and 402 will turn on more strongly. Current will increase from current sources 401 and 402 until the voltage drop across resistor 422 equals a voltage difference across PNP transistors 427 and 429.

With variations in VDD, transistors 406 and 407 will not vary with respect to one another as described below. With the gate and drain of transistor 406 connected together at node n4, node n4 will be at 1 vt below VDD. The transistors 413 and 414 do not have their source and drain connected together. Further, the sources of transistors 413 and 414 are connected to a common node n14, so the source of transistors 413 and 414 will be at the same voltage. The voltage at the gates of transistors 413 and 414 will be pulled to the same value. An identical source and gate voltage is applied to transistors 406 and 407, so, the drain voltages of transistors 406 and 407 will be equal and transistors 406 and 407 will source the same current irrespective of VDD changes.

To assure current sources 401, 402 and 405 provide the same current irrespective of loading. Typically transistors 429 and 427 have bases connected together through a current sink to ground to assure variations in current between sources 401 and 402 do not occur. However, transistors 413 and 414 are sized to have a significantly low threshold, removing the need to connect the bases of transistors 427 and 429 together to assure the voltage at nodes n13 and n14 provide for turn on of both transistors 413 and 414.

Transistors 431, 435, 439, 440, 441, 442 and 443 serve as a circuit to prevent a forbidden state from occurring. In the circuit of FIG. 5C, node n1 can go high while transistors 413 and 414 remain off. With the transistors 431, 435, 439, 440, 441, 442 and 443 included to prevent such a state, when node n1 goes high, transistor 431 turns off allowing only transistors 443 and 435 to pull down node n16 and turn on transistor 409. Transistor 443 has a source voltage set by diode connected transistors 440–441 below VDD, providing a voltage of 2 vt=2*(0.7V)=1.4V below VDD. Transistor 435 has a gate voltage provided to turn it on when transistor 431 is on at approximately VDD. Transistor 409 will turn on to pull up node n8 and turn on transistors 413 and 414. With transistor 413 on, node n4 will be pulled down to turn on transistor 407. Transistor 407 will then pulls up node n5 to turn off transistor 408. With transistor 419 on, node n1 will be pulled down to get the circuit of FIG. 5 out of the forbidden state. With node n1 pulled down, transistor 431 will turn on to pull up n9 to turn off transistor 409 so that the forbidden state circuitry is ineffective.

An RC filter made up of transistor 404 and a capacitor connected transistor 403 is included in the circuit of FIG. 5 to damp out potential oscillations caused by feedback from loading on the VDIODE connection.

The voltage VDIODE is provided from two different source paths. A first path is provided through PMOS transistors 435 and 436, while a second path is provided through PMOS transistors 434 and 437. The gate of transistor 435 is driven by node n1 so that its current increases with increases in temperature as with current source transistors 401, 402 and 405. Transistor 434 receives a gate input from node n10 which causes current to be generated from the drain of transistor 434 which decreases with temperature, as described subsequently. The decreasing and increasing currents with temperature changes then cancel out to provide a current which does not vary significantly with temperature changes through to resistor 438 to provide VDIODE. Transistors 436 and 437 receive a gate voltage from node n14 which provides the turn on voltage to these PMOS pass gates similar to PMOS pass transistors 410 and 411 which pass current from current sources 401 and 402.

The voltage at node n9 drives the gates of transistors 420 and 426. Transistor 420 then provides a similar drop from transistor 415 as transistor 414 provides from transistor 407. Transistors 415 and 416 are connected in a current mirror amplifier configuration with transistors 420, 421 and 426, replicating current mirror amplifier transistors 406, 407 413, 414 and 425, but with the inverting and non-inverting inputs reversed. The drain of transistor 415 then drives the gate at node n10 of current sources 412 and 417 with a voltage opposite that applied to node n1. Transistor 418 receives the gate voltage from node n14 similar to transistors 410 and 411 and provides current from transistor 412 to a resistor 428 and the gate of transistor 421. With resistor 428 having temperature characteristics varying opposite those of a diode, the voltage on node n10 will then vary such that current from all of current sources 412, 417 and 434 decrease with temperature.

With current from current source 405 increasing with temperature changes, and current from transistor 417 decreasing with temperature, the current reference VBSNRF will provide a reference current which does not vary significantly with temperature. Gates of transistors 423 and 424 are connected to node n14 to enable then to replicate pass transistors such as 411 and 418. The diode connected transistor 430 is provided to connect the VBSNRF point to a ground reference such as the one marked ZERO. A number of circuits including the transistors 405, 417, 423, 424 and 430 can be provided with the same transistors operating in parallel to provide the current reference VBSNRF throughout a complex circuit if desired.

II. Output Buffer

Figure 7B:
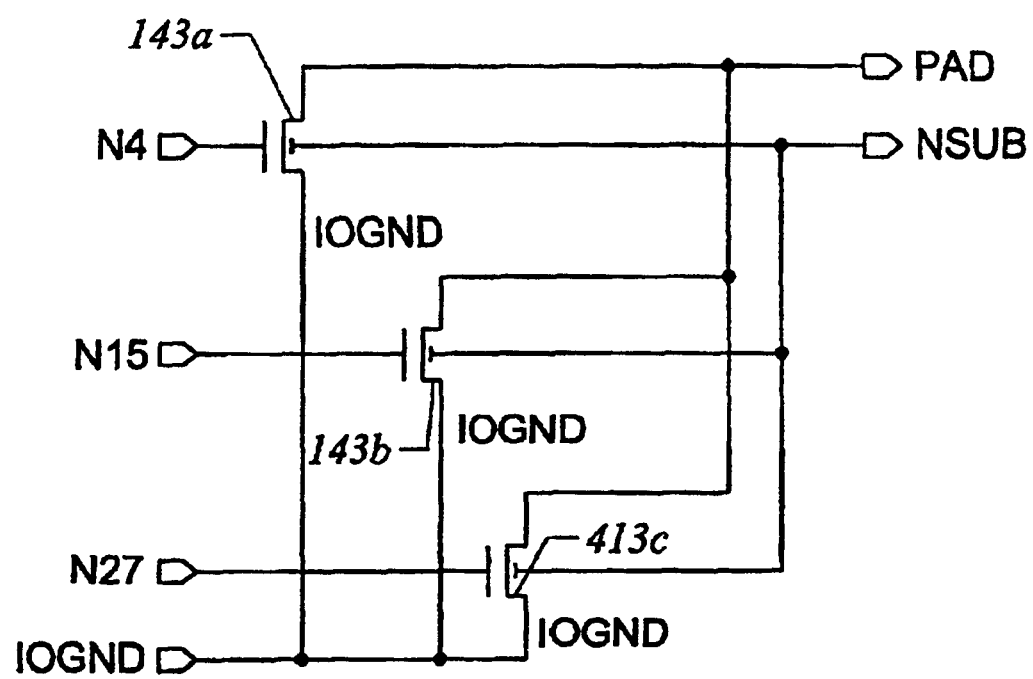
FIG. 7B shows further circuitry for the pull down portion of the output buffer of FIG. 7A.
Figure 8A:
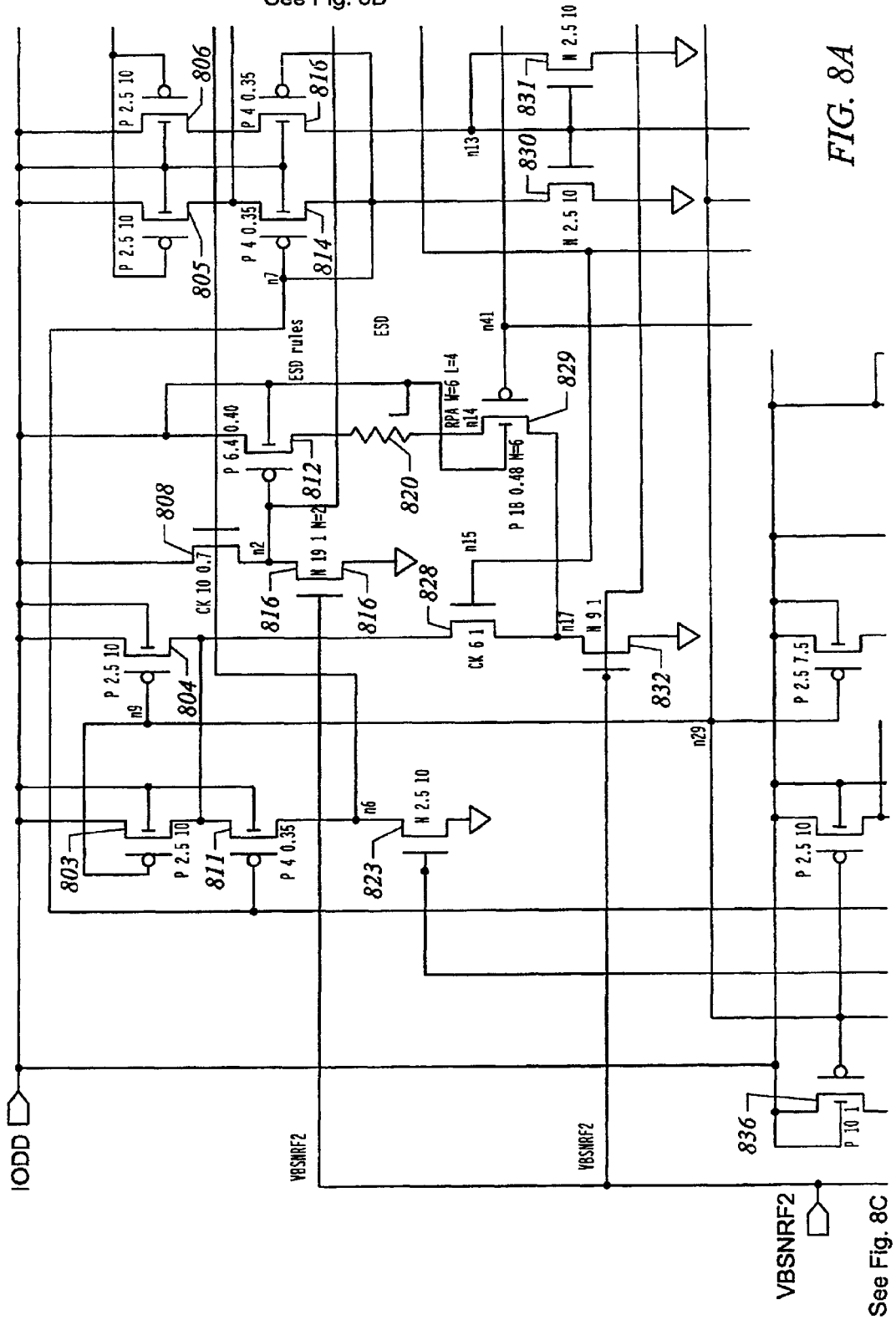
FIGS. 8A–E shows circuitry providing pull up transistor voltage references for the output buffer circuitry of FIGS. 6A–D.
Figure 8B:
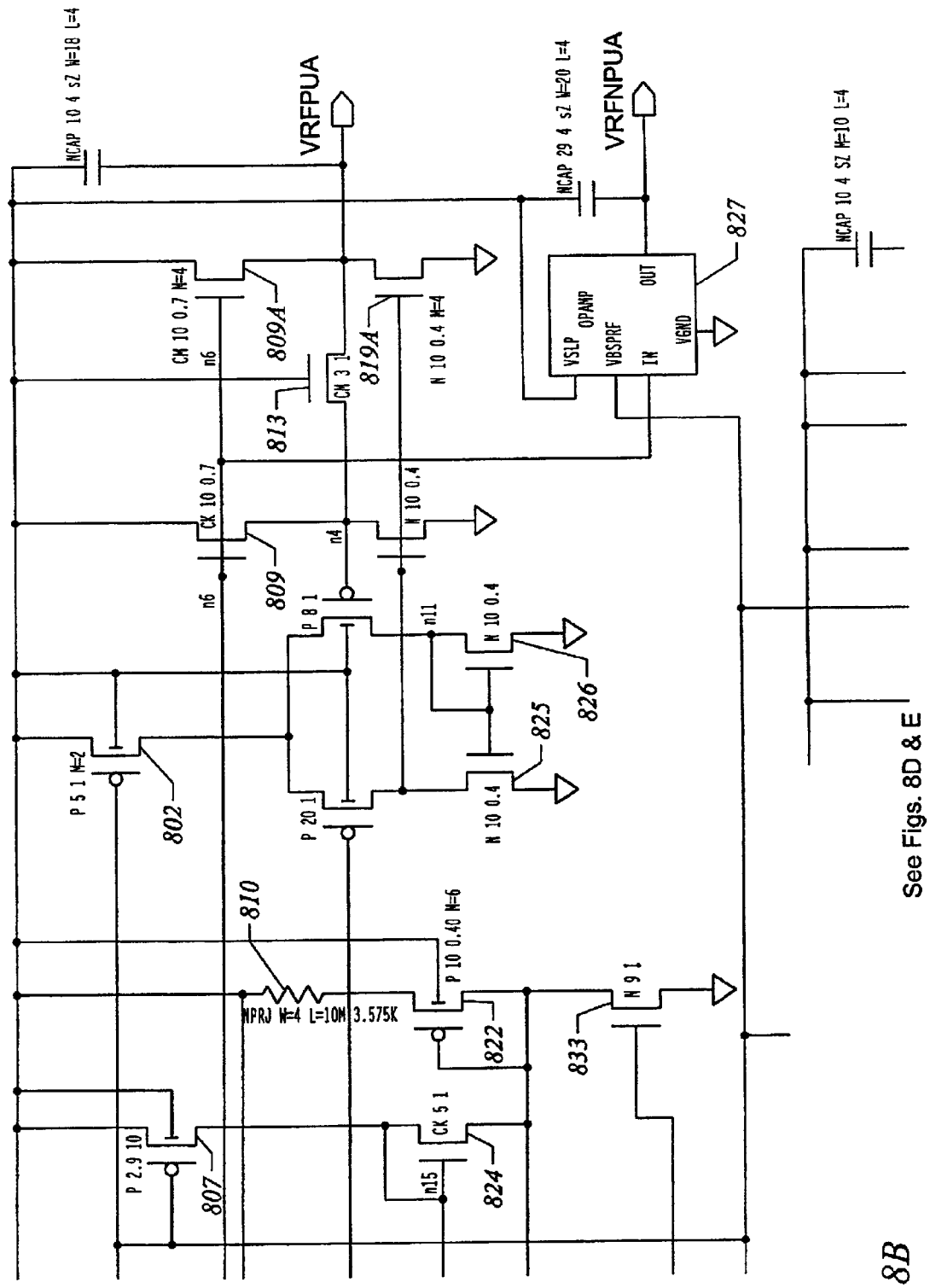
Figure 8C:
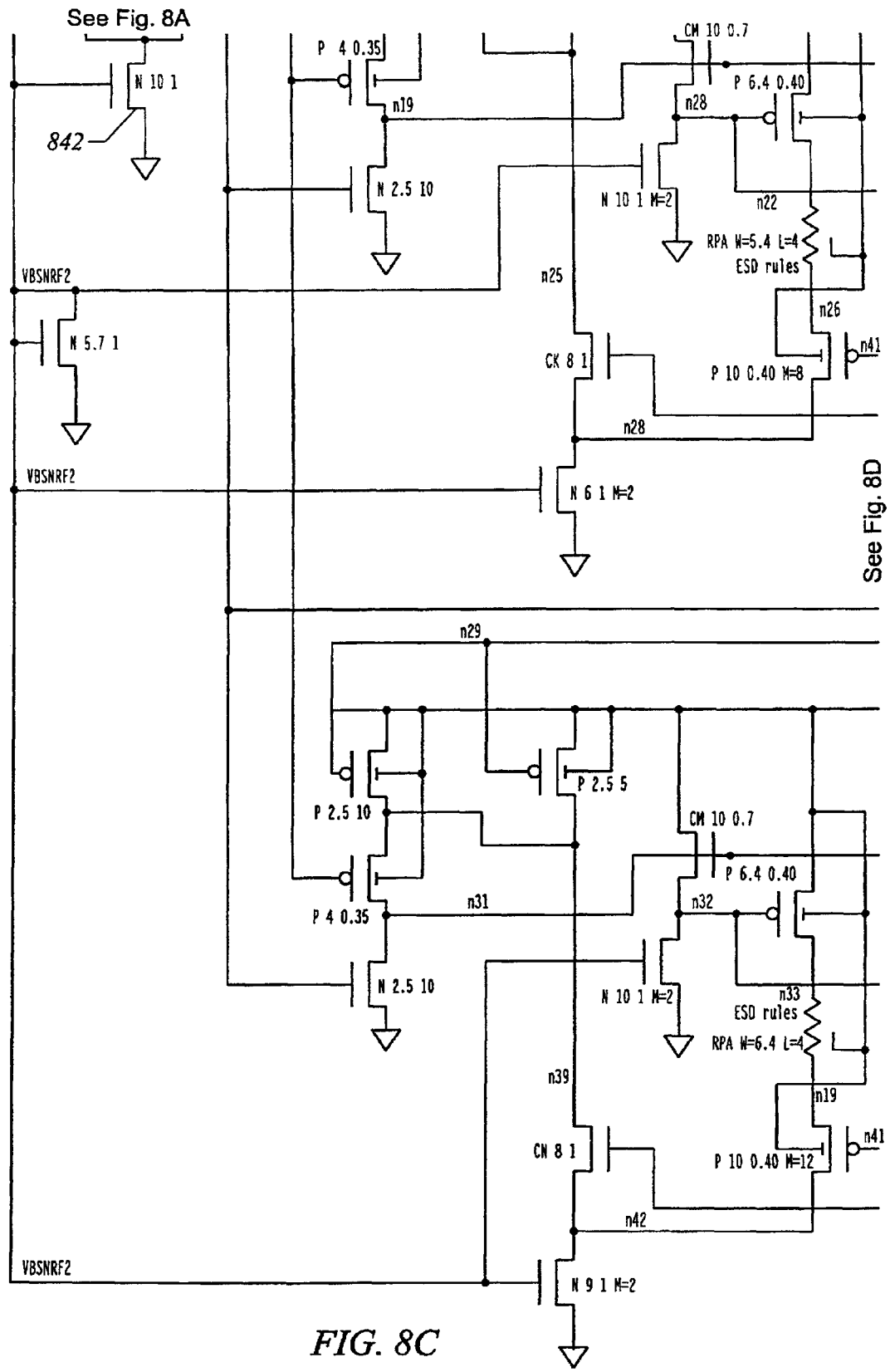
Figure 8D:
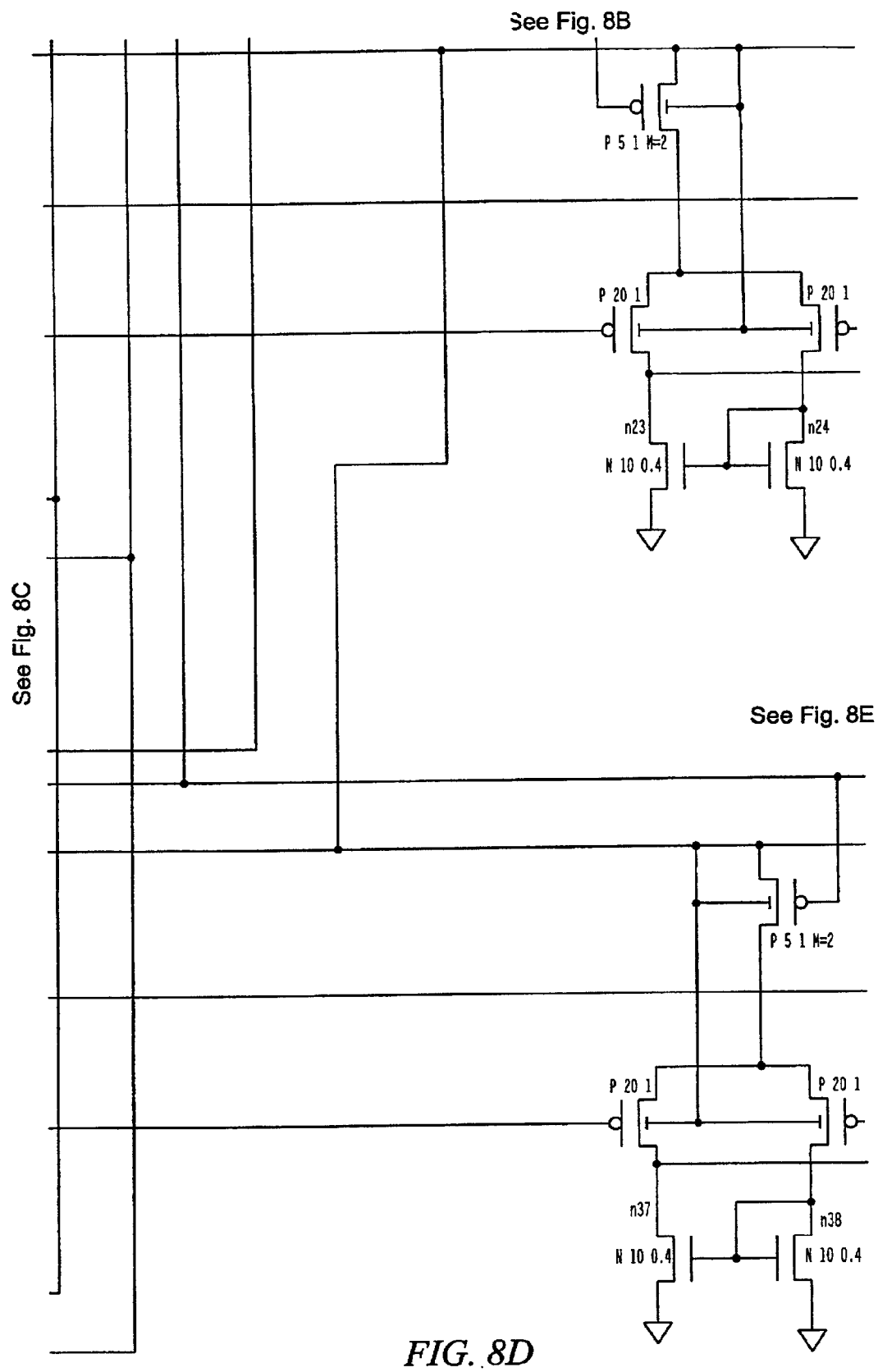
Figure 8E:
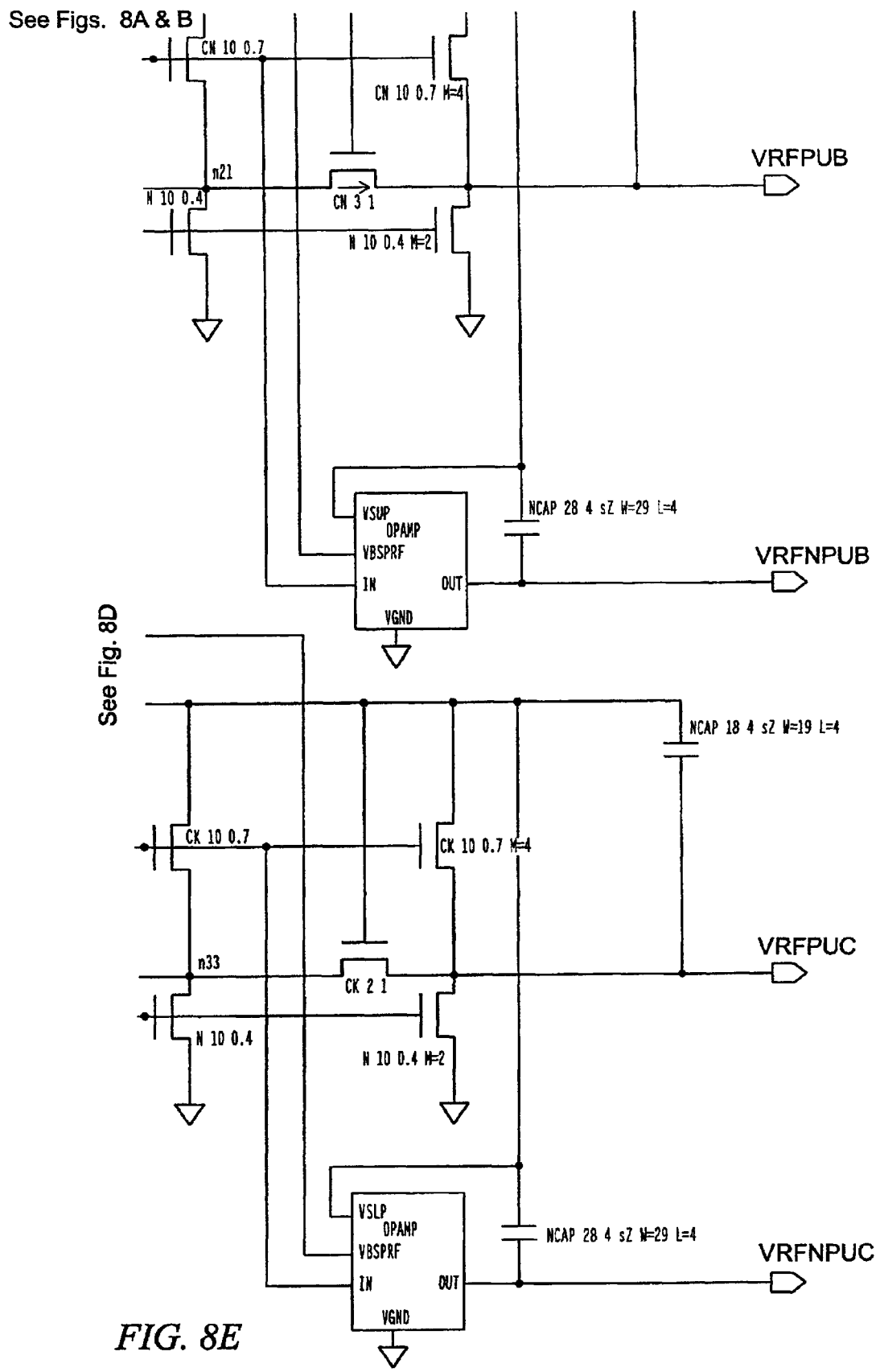

Circuitry for the output buffer in accordance with the present invention is shown in FIGS. 6 and 7. The output buffer shown includes circuitry to provide a programmable drive strength. The output buffer is also programmable as either push-pull, pull-up only, or pull-down only. The circuitry 900 in FIG. 6 is the pull-up driver while the circuitry in FIGS. 7A–7B is the pull-down driver.

To enable the circuit to provide programmable drive strength two pull up circuits 510 and 511 are included to drive the pad. Similarly, three pull down circuits 521–523 are connected to the pad. The OEB input provides the overall output enable signal, with low indicating enablement. The input pull up signals PUENB1 and PUENB2 and pull down signals PDENB1 and PUDENB2 enable respective portions 510–511 and 521–523. The PAD is connected to an output pin of the integrated circuit containing the input/output buffer for providing a signal to an external circuit. The input D is the signal which is buffered by the output buffer of FIG. 6 to provide at the PAD.

The pad is driven by a CMOS buffer including a PMOS pull up transistors 111a and 111b and NMOS pull down transistors 143a–143c. The PMOS transistors 111a and 111b connect a pull up current reference IODD directly to the PAD, while the NMOS transistors 143a–143c connect the pull down current reference IOGND directly to the PAD. Switching circuitry controls the gates of transistors 111a, 111b and 143a–143c to drive the PAD with a desired current level depending on if the enable signals OEB, PDENB1, PDENB2, PUENB1, PUENB2, or PUENB3 are active.

For convenience, for subsequent descriptions of circuitry in the pull up circuits 510 and 511, components of only 510 will be described where components 511 are identical. Similarly, for descriptions of circuitry in the pull down circuits 521–523, components of only 521 will be described where components of 522 and 523 are identical.

A. Pull Up Circuitry

The pull-up circuitry controlling the gate of transistor 111a uses high voltage switches for control. In the pull up portion, the signal D is inverted through inverter 637 and provided to the gate of pull down transistors 619, 620, 624 and 621. The signal D further is provided through transistor 618 to the gate of transistor 609 which pulls up transistor 609 which controls the node n5 at the gate of transistor 111a. The signal D directly controls the gate of transistors 619 and 624 to pull down node n5. Transistor 620 controls pull down of node n3, and transistor 621 controls pull down of node n7 which provide a function discussed in more detail below.

A reference voltage VRFPU is controlled to provide the desired gate voltage to the gate of transistor 111a for the desired mode once transistor 111a is turned off sufficiently. The reference voltage VRFPU is provided through a pass gate 613 to the gate of transistor 111a. The gate of pass gate 613 is controlled by the output of NOR gate n25 to turn on after the signal D has transitioned from high to low and while INB is low, and has not transitioned to high enabling a rapid pull down of transistor 111a. The inputs of the NOR gate, thus include the signal D from the output of inverter 637 as provided through a second inverter 623, and a second input INB is provided through a switch 679. The switch 679 has a time delay set to assure the PAD has sufficiently transitioned before VRFPU is applied to the gate of transistor 111.

The output of NOR gate 625 is further applied to the gate of PMOS transistor 602 which connects IODD to transistor 608. Transistor 608 has a gate receiving a reference VRFNPU which controls current applied to node n5 to control pull up of the gate of transistor 612. The transistor 602 turns off so that VRFPU provides a lower current gate voltage to node n5 after pull up of the gate of transistor 612.

The lower current VRFPU enables rapid switching of the transistor 612 during a subsequent transition of the PAD to high when D changes to pull down node n5.

Details of the operation of the pull-up circuitry with high voltage circuitry for the output buffer of FIG. 6 are described in the sections which follow.

1. Off State

Initially the input D is assumed to be high. With D high, node n12 will be pulled low through pass transistors 638 and inverter 637. Node n12 going low allows node n6 through transistor 618 to turn on transistor 609 to pull up node n5 which turns off the pull up driver transistor 111a. With node n12 low, all of the NMOS pass transistors 619, 620, 624 and 621 will be off.

With node n12 low transistor 618 will typically be on with a high applied to its gate, since INB will maintain the inverse of the previous state of D, or a low, to turning on PMOS transistor 636a and turning off NMOS transistors 622 and 642. Note that VSLEWPU will be on sufficiently to turn on transistor 6100 to pull down the gate of transistor 636b to turn on transistor 636b to carry current from 636a to the gate of transistor 618. Further, after startup, when PUPB is high, transistor 639 will be on to connect the gate of transistor 636b directly through transistor 647 to ground if the reference N5VTOLB is high. N5VTOLB is provided in PCI mode when voltage control of VSLEWPU is not desired.

With the gate of transistor 636b low, a low will be applied to an inverter formed by transistors 635 and 641 to provide a high to the gate of transistor 617 to torn it on. Transistor 617 will then connect node n12, which is low to node n2 to make n2 low. Node n2 being pulled low will turn on PMOS transistors 605 and 606. Transistor 606 will then serve to provide additional current to pull node n5 high. Transistor 605 will pull node n3 high. With INB low, NMOS transistor 616 will be on to connect nodes n5 and n3. Node n3 and n5, both being high, will then provide significant current to pull up the gate of transistor 111a.

The channels of the PMOS switching transistors are connected together to a common well PSUB. The common well PSUB also forms the channel of pull-up transistor 111a. The voltage on PSUB is controlled to set the nwell voltage to enable discharge when the voltage on the PAD exceeds IODD. The PSUB nwell is connected to the drain of transistor 629 which has a source connected to IODD at the gates of transistors 614, 615, 611, 618 and 603. The drain of transistor 629 further connects to the source of transistors 635 and 636a. A resistor 668 connects the PAD to the drains of transistors 628, 611, 610, 614, 615, and 603.

In operation when IODD exceeds the PAD voltage, transistors 609, 610, 611, 614 and 615 will be off since the voltage on their gate will exceed their source to drain voltage. Thus, no current will be provided through resistor 668 to the PAD. Should the PAD voltage exceed IODD, transistors 628, 611, 610, 614, 615 and 603 will all turn on. IODD will then be connected through transistor 603 to pull up node n3, through transistors 610 and 611 to pull up node n2 and the gate of transistor 111a, through transistor 614 to pull up node n6 and transistor 615 to pull up transistor 615 to prevent damage to transistors driving the PAD and to pull down the PAD until it reaches IODD. Similarly, should the nwell connected to PSUB be pulled higher than IODD, with the transistor 629 connecting PSUB to IODD, transistors 628, 622, 610, 614, 615 and 603 will all turn on to prevent damage to the transistors, and to pull PSUB down to the PAD voltage.

The enable signals PUENB2 and OEB are connected through NOR gate to the gates of transistors 638 through an inverter 634 and to a transistor 631. When both PUENB2 and OEB are low, transistor 631 will be off and transistors 638 will be on. With either PUENB2 or OEB high, the output of 638 will be high to turn off transistors 638 and remove the signal D from the input of inverter 637, and turn on transistor 631 to drive the input of 637 high. As a result, a high will be provided to the gate of transistor 111a to turn it off, as described above with D high.

The enable signals for both of the circuits 510 and 512 are provided to the inputs of NAND gate 645. With either circuit 510 or 511 not enabled, a high signal will be provided from the NAND gate 645 to turn on transistor 646 and turn off transistor 628. Transistor 646 being on and N5VTOLB either on or off, overvoltage protection transistor 629 will be on to assure PSUB does not exceed the PAD. With both circuits 510 and 512 enabled, a low signal will be provided from the NAND gate 645 to turn off transistor 646 and turn on transistor 628. With the output of 645 low, and N5VTOLB low, the transistor 629 will be turned off, and overvoltage protection for the substrate PSUB will be removed.

2. On State

When the D input goes low, the output of inverter 637 transitions to high to pull node n12 high. Further, with n12 high, transistor 618 driving node n3 will pull node n3 high to turn off transistors 608 and 609. As transistor 618 easily overcomes transistor 607, transistors 608 and 609 are turned off allowing transistor 621 to pull down node n7 and transistors 619 and 624 to pull down node n5. Transistor 607 will be on to enable a more rapid transition of node n3 when later transitions back to high.

With node n12 high, transistors 619, 620, 624 and.621, will then all turn on. INB will be initially high to turn on transistors 622, 626 and 627. Transistor 632 will further be on with a high from switch 681 as controlled by INB. Node n5 is now freely pulled down by transistors 619 and 624 until its descent is limited by clamp transistor 608 driven by VRFNPU. In this way VRFNPU applied to the gate of transistor 608 limits the initial current of driver transistor 111a.

The drive current of transistor 111a is thus regulated until the pad crosses the input buffer threshold which will cause INB to switch low and turn off transistors 622, 626 and 627. Further, after a delay for switch 679, INB switching will turn off transistor 632 and transition the NOR gate 625 to turn off transistor 602 and turn on transistor 613. All of the pull down transistors for node n5 being off allows node n5 to raise and reduces the drive current of transistor 111a, allowing a more ideal graduated drive current during switching. Transistor 613 turns on to connect VRFPU to node n5 to clamp the output with a more limited drive current.

A slew rate reference voltage VSLEWPU to control the slew rate the pull up driver transistor 111a is provided to the gate of transistor 649 and 648 to control pull down of the gate of transistor 111a. Slew rate will increase with INB switching because 626 will turn on to enable 648 to support 649. The slew rate reference further controls transistor 6100 which drives the inverter formed by transistors 635 and 641. Should PSUB go higher than the PAD voltage, transistor 635 will turn on transistor 617 to connect nodes n2 and n12 to assure IODD is connected to drive transistors of both nodes to prevent transistor damage.

A further slew rate control signal SLEW is provided to the gate of transistor 643. Transistor 643 is coupled through transistors 619, 626 and 648 to pull node n5 to ground in conjunction with transistors 627 and 620 if the slew rate signal SLEW is high. If the slew rate signal SLEW is low, transistors 627 and 620 act alone to reduce the speed of pull down of node n5 at the gate of transistor 111a.

For GTL mode, the pull up portion is specified as an open drain. The circuit of FIG. 6, thus, provides a GTLSLEW signal indicating the logic state of the pull up portion. For the GTL mode, a signal GTLSLEW is provided to simply select a resistor for pull up, and a CMOS pull down. Noise from pull up circuitry during pull down is undesirable.

Circuitry to generate GTLSLEW receives the inverse of the SLEW signal from inverter 682, and the PUENB1 and PUENB2 enable signals. Three PMOS transistors 688, 689 and 690 which receive the SLEWB, PUENB1 and PUENB2 signals at their gate and, connect VDD to GTLSLEW, while three series NMOS transistors 691, 694 and 696 receive the SLEW, PUENB1 and PUENB2 signals at their gate and connect GTLSLEW to the VSLEWPU reference to provide the open drain spec. With any of SLEW, PUENB1, or PUENB2 enabled, GTLSLEW will go to VDD. With all three of SLEW, PUENB1, and PUENB2 disabled, GTLSLEW will be connected to VSLEWPU.

B. Pull Down Circuitry

FIGS. 7A and 7B show the pull down portion of the output buffer. In the pull down portion, the signal D is provided through pass gates 716 and inverted through inverter 711 and provided to the gate of pull down transistor 712. Transistor 712 connects ground to the gate NG4 of pull down driver transistor 143a. The signal D is provided directly from pass gates 716 to a first input of NOR gate 706. A second input of NOR gate 706 is provided the signal INB which is provided through an inverter 729 and delay switch 728. The output of NOR gate 706 drives the gate of PMOS transistor 708 which connects VDD to the gate NG4 of the first pull down driver transistor 143a.

A reference voltage VRFPD is controlled to provide the desired gate voltage to the gate of transistor 143a once transistor 143a is turned off sufficiently. The reference voltage VRFPU is provided through a pass gates 723 and 724 to the gate of transistor 143a. The gate of pass gate 714 is controlled by the INB signal as provided from inverter 729. The gate of transistor 723 is provided from the signal D as provided from the output of inverter 711. Thus, transistors 714 and 727 apply VRFPD to NG4 after D has transitioned from low to high and INB transitions from low to high. The switch 729 has a time delay set to assure the PAD has sufficiently transitioned before VRFPU is applied to the gate of transistor 143a.

A reference voltage VRFPPD is controlled to provide current to the gate of transistor 143a to control pull down of the gate of 143a during a transition of D from low to high. The reference voltage VRFPPU is provided through a pass gates 723 and 724 to the gate of transistor 143a. Transistor 713 has a gate receiving VRFPPD which controls current applied to. NG4 to control pull down of NG4 at the gate of transistor 143a. Transistor 713 is connected to ground through transistor 721. Transistor 721 has a gate connected to receive INB from the gate of switch 728 enabling turn off of transistor 713 after NG4 is sufficiently pulled up so that VRFPD can be applied to hold NG4 to a desired level. The lower current VRFPD enables rapid switching of the transistor 143a during a subsequent transition of the PAD when D changes.

The enabling circuitry of the pull down portion includes the NOR gate 750 with inputs controlled by the OEB and PDENB signals. The pull down enable portion further includes the inverter 715, pass gates 716 and pull down transistors 719 and 727. The output of NOR gate is further provided through transistor 718 to the gate of transistor 724 and through transistor 725 to ground. The signal OEB is further provided through inverter to NAND gate 730 along with the input signal D to enable switching of switch 728 upon transitions of D.

Details of the operation of the pull-down circuitry with high voltage circuitry for the output buffer of FIGS. 7A and 7B are described in the sections which follow.

1. On State

Initially, the input D is assumed to transition from high to low which will pull node n6 and the output of inverter 717 high to turn on transistor 712 to connect node NG4 to a voltage controlled by GTLSLEW applied to the gate of transistor 720, the value of GTLSLEW set in the output buffer pull up circuit of FIG. 6 as discussed previously. With node n6 high, transistor 723 will further be turned off to disconnect VRFPD from NG4. D being low will turn off transistor 711 to disconnect NG4 from pull up transistors 702 and 704. INB will transition from high to low to turn on transistor 721 through inverter 729 initially and then turn off transistor 721 after a short time. In this manner transistor 713 assists in pull down of NG4 with transistor 714 and then resets for a subsequent transition of D back to high. D being low will assure the output of NAND gate 706 is high to turn off transistor 709 and disconnect transistors 704 and 702 providing VDD to NG4.

2. Off State

When D goes from low to high, node n6 is pulled down by inverter 711 to turn off transistor 712 to disconnect NG4 from VSS. Further transistor 723 is turned on. With INB being initially low, inverter 729 will provide a high to turn transistor 714 off disconnecting VRFPD from NG4. With D high and the output of inverter 729 initially high, NAND gate 706 will provide a low to turn on transistor 709 to initially connect VDD to NG4 through transistors 704 and 721 to provide a strong pull up to NG4. Further, with D high, transistor 711 will turn on to connect 704 and 721 directly to node NG4 to further provide a strong pull up to NG4. With INB initially making inverter 729 high, transistor 721 will be on and VRFPPD will control current to the gate of transistor 713 to limit pullup of NG4.

With INB transitioning to high and inverter 729 going low, transistor 718 will turn off, and the output of inverter 722 will go high to turn on transistors 726 and 725 enabling the gate of transistor 711 to be pulled low so transistor 711 will be off. Further, the output of inverter 728 will turn off transistor 706 to disconnect VDD through 721 from NG4. After a short period when switch 728 transitions to low to turn off NAND gate 728 and switch off transistor 709 to disconnect VDD from NG4. Transistor 721 turns off to disconnect VRFPPD from controlling switching of NG4, and transistor 723 turns on to enable VRFPD to control the level of NG4 with minimal drive current before a subsequent transition of D.

A slew rate control signal VSLEWPD reference is provided to the gate of transistor 704 with a voltage level set to control current through transistor 704 to control the slew rate on pull of node NG4. Further, a signal SLEW is provided to transistors 701 and 706. With SLEW enabled at high, transistor 701 will be off, and transistor 706 will be on so that VSLEWPD controls both transistors 704 and 702. With SLEW disabled as low, transistor 701 will be on to provide a high to the gate of transistor 702 to turn it off, so that transistor 704 will act alone.

C. References For Output Buffer

1. Pull Up Circuit Reference

FIG. 8 shows a reference circuit used to generate the references VRFNPU and VRFPU for the output buffer pull up circuit of FIG. 6. The circuit of FIG. 8 provides three references VRFNPUA, VRFNPUB and VRFNPUC, one of which may be selected to drive the reference VRFNPU of FIG. 6. Similarly, three references VRFPUA, VRFPUB and VRFPUC for selectively driving the reference VRFPU of FIG. 6. As indicated previously, the reference VRFNPU is designed to provide significant drive current to pull up driver transistor 111a depending on load conditions during transition of the PAD from high to low, while VRFPU provides minimal drive current once the PAD is transitioned to low to prepare for a subsequent transition back to high.

The circuit components providing VRFNPUA, VRFPUA are substantially similar to those providing VRFNPUB, VRFPUB, which in turn is similar to the components providing VRFNPUC and VRFPUC. For convenience, only the components providing the references VRFNPUA and VRFPUA which are similar to other circuit components will be described. Components sizes are scaled so that when normalized, the circuit providing VRFNPUA, VRFPUA will provide a current level of 1, VRFNPUB,VRFPUB will provide a higher pull up level of 1.33 and VRFNPUC, VRFPUC will provide a current level of two. The desired references can be connected to provide VRFNPU and VRFPU of FIG. 6 depending on the desired drive current level.

In FIG. 8, transistor 812 is intended to be a facsimile of the output pull up driver transistor 111a in FIG. 6. Transistor 808, then, is a facsimile of transistor 809 in FIG. 6 which provides current directly from IODD to the gate of transistor 111a. Transistor 816 is then a facsimile of transistor 819 of FIG. 6.

Transistors 822 and 829 form a differential pair. A resistor 810 is connected between IODD and the source of transistor 822 to create a desired voltage of 0.4 volts below IODD at the source of transistor 822. Thus, if the voltage at the source of transistor 829 is higher than 0.4 volts, the difference will be amplified at node n17 to provide significant current to node n17 causing a significant voltage rise at the source of transistor 832. Transistor 828 then forms a cascode transistor, so as the voltage rises on its source, it turns off. The drain of transistor 828 is connected to the source of transistor 811, so with transistor 828 turning off, increased current will be provided to node n6. With node n6 increasing, the voltage on the gate of transistor 806 which mimics 808 of FIG. 8 will go up as will VRFNPUA connected to node n6 through OPAMP 827.

Transistor 816 receives a voltage reference VBSNRF set to just turn on an NMOS transistor 812 so that only a weak current is drawn. Further transistor 842 has a gate receiving VBSNRF2 to enable it to turn on minimally. Transistor 842 has a drain connected to the gate and drain of PMOS transistor 836, and the source of transistor 836 is connected to IODD so that minimal current flows through both 842 and 836 to assure they are turned. Further, a reference is provided using transistors 805, 806, 814, 815, 830 and 831 to provide isolation from IODD. Transistors 805 and 806 have gates connected together to the gate of transistor 836 so that they will minimally turn on. PMOS transistors 814 and 815 then connect the drains of transistors 805 and 806 to the sources of transistors 830 and 831. The gates of transistors 814 and 815 are connected together to the source of transistor 814 to draw minimal current. Further, the gates of transistors 830 and 831 are connected together to the source of transistor 831 to draw a minimal current to turn on. With the gate of transistor 811 connected to the gate of transistors 814 and 815, it will turn on sufficiently in series with transistor 803 which has its gate connected to the gate of transistor 836 to assure it is minimally on. Similarly, transistor 823 has its gate connected to the gates of reference transistors 830 and 831 to assure it is at least minimally on. The minimal current drawn enables a weak bias reference current to be provided to draw minimal power in steady state operation.

As connected with reference transistors 805, 806, 814, 815, 830, 831, 836 and 842, the series transistors 809, 811 and 823 will provide desired current amplification without being dependent on fluctuations in IODD. Transistors 828 and 811 function as cascode type transistors to enable the current provided from node n17 to be replicated at node n6 with minimal dependency on changes in IODD. Should IODD be separated from the reference VRFNPUA by only one PMOS diode connected transistor, VRFNPUA current would fluctuate with changes in IODD.

Thus, in operation to provide VRFNPUA, the circuit of FIG. 8 provides sufficient current to VRFNPUA to turn on the gate of transistor 808 in FIG. 6 to drive the gate of transistor 111a during a high to low transition of the gate so that it provides sufficient drive current to the PAD. Should a significant load be on the PAD, the required drive current at the gate of transistor 808 will increase to pull down VRFNPUA resulting in transistor 806 causing current to be provided to both node n17 and node n6 to provide additional current to drive the gate of transistor 806 and VRFNPUA. Although the resistor 810 has a size to create a voltage of 0.4 volts to set the drive current, other values could be used to meet desired design requirements. With the signal VRFNPUA driving the gate of transistor 808, which functions to provide current to drive the gate of transistor 111a during transitions of its gate from high to low, the drive current of transistor 111a will be precisely controlled to be a desired level.

Once the gate of transistor 111a is transitioned so that the PAD is pulled low, the gate of transistor 111a is driven directly from the reference VRFPUA to assure transistor 111a remains pulled down with a desired drive current to prepare for a subsequent low to high transition. The signal VRFPUA is provided from the sources of transistors 819 and 819A. Transistors 819 and 819A are NMOS devices with drains connected through PMOS transistors 809 and 89A to IODD. The sources of transistors 825 and 826 are driven by the gates of transistors 817 and 818. The gates of transistors 809 and 809a are connected to node n6 which provides VRFNPUA. Thus, 809 and 809a provide the same drive current as set by VRFNPUA while VRFNPUA is still applied, and then a voltage at the gates of 809 and 809a is provided to minimally turn them on so that only a weak current is provided through transistors 819 and 819A. With VRFPUA, then applied as the gate voltage to the gate of transistor 111a, it will then be weakly turned on.

The gates of transistors 819 and 819A are connected in common to the drain of transistor 825. Sources of transistors 825 and 826 are connected to VSS. Drains of transistors 825 and 826 are connected to drains of transistors 817 and 818. The gate of transistor 818 is driven by the reference VRFPU, while the gate of transistor 817 is driven by transistor 806 at node n2. Transistor 821 connects the sources of transistors 817 and 818 to IODD, and has a gate connected to transistor 826 to provide a PMOS diode drop from,IODD.

The channel of all of the PMOS transistors are connected to common n-well tied to IODD. The n-well of the reference circuit then is connected to the ESD protection circuitry of the pull down circuit of FIG. 8 to prevent IODD, or a n-well voltage from exceeding the PAD voltage.

The sizes of the transistors 822 and 828 in the circuit providing VRFNPUA, VRFPUA are different than the size of similar circuitry providing VRFNPUB, VRFPUB to enable a different current drive strength to be provided by each circuitry. Similarly, the size of comparable transistors to 822 and 828 in the circuit providing VRFNPUC, VRFPUC are altered so that different selectable current drive strengths can be provided.

In operation, the transistors 817, 818, 825 and 826 are designed to draw the minimal drive current necessary, so transistors 819 and 819A which control VRFPU will provide a minimum drive current to VRFPU once the gate voltage on transistors 809 and 809A is minimized when VRFNPUA is disconnected. Transistor 808 functions as a facsimile of transistor 808 of FIG. 8, and during the final transition of the PAD from high to low will control the drive current through transistor 817. Once transistor 808 of FIG. 8 is off, the minimum drive current for VRFPU for transistor 111a will be controlled by the minimum current to turn on transistor 818 which is also connected to VRFPU. With transistor 818 providing current to transistor 826, and transistor 826 controlling current to transistors 819 and 819A, VRFPU will be controlled to assure sufficient current is provided to turn off VRFPU to a desired degree.

2. Pull Down Circuit Reference

Figure 9:
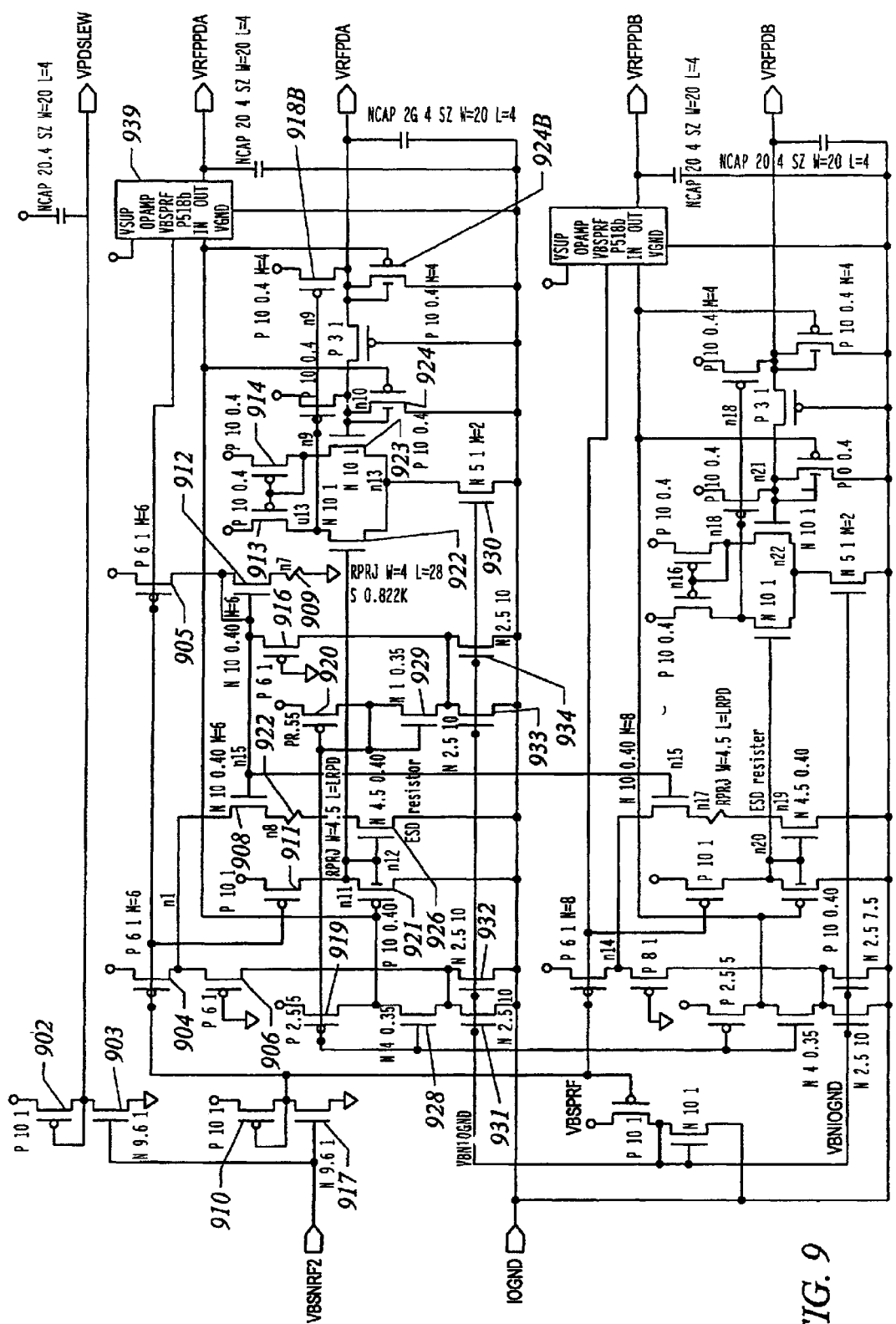
FIG. 9 shows circuitry providing pull down transistor voltage references for the output buffer circuitry of FIGS. 7A–7B.

FIG. 9 shows a reference circuit used to generate the references VRFPPD and VRPFPD for the output buffer pull down circuit of FIGS. 7A and 7B. The circuit of FIG. 9 provides two references VRFNPDA and VRFNPDB, one of which may be selected to drive the reference VRFPPD of FIG. 7A. Similarly, two references VRFPDA and VRFPDB are provided to selectively drive the reference VRFPD of FIG. 7A. As indicated previously, the reference VRFPPD is designed to provide significant drive current to pull up driver transistor 143a depending on load conditions during transition of the PAD from low to high, while VRFPD provides minimal drive current once the PAD is transitioned to high to prepare for a subsequent transition back to low. The circuit of FIG. 9 further provides a reference VPDSLEW to set the slew rate for pull down for providing to the circuit of FIG. 8.

The circuit components providing VRFPPDA, VRPPDA are substantially similar to those providing VRFPPDB, VRFPDB. For convenience, only the components providing the references VRFPPDA and VRFPDA which are similar to other circuit components will be described. Components sizes are scaled so that when normalized, the circuit providing VRFPPDA, VRFPDA will provide a current level of 1, VRFPPDB, VRFPDB will provide a higher pull down level of 1.33. The desired references can be connected to provide VRFPPD and VRFPD of FIG. 7A depending on the desired drive current level.

In FIG. 9, transistor 926 is intended to be a facsimile of the output pull down driver transistor 143a of FIG. 7B. Transistor 921 then is a facsimile of transistor 913 in FIGS. 7 which provides current to VSS or IOGND from the gate of transistor 143a.

Transistors 908 and 909 form a differential pair. A resistor 912 is connected between VSS or IOGND and the source of transistor 909 to create a desired voltage of 0.4 volts above IOGND at the source of transistor 909. Thus, if the voltage at the source of transistor 908 is lower than 0.4 volts, the difference will be amplified and provided at the drain of transistor 911.

The source of transistor 908 is connected to the source of PMOS transistor 906. As connected, with additional current drawn through node n8, less current will be drawn through transistor 906 to the drains of transistors 931 and 932. With less current through transistor 906 to transistor 931 and 932, additional current will be provided through transistor 919 to transistors 931 and 932 to charge up the gate of transistor 921. Transistor 921 is a facsimile of the transistor 713 of FIG. 7A. So, the gate of transistor 921 is used to provide the reference voltage VRFPPDA through the operational amplifier p518a.

The gates of transistors 931 and 932 are connected to a reference VBNIOGND. NMOS transistors 938 and PMOS transistor 936 are connected in series with the gate and drain of transistor 938 connected together so that VBNIOGND remains 1 vt above ground, or just high enough to turn on an NMOS transistor. The voltage VBIOGND is further provided to transistors 933 and 934 to provide current sinks. The gates of transistors 920 and 929 and drain of transistors 920 and 929 are connected together, and the source of transistor 929 is connected to the source of transistors 933 and 934 to provide a minimum current to assure transistors 920, 929, 933 and 934 are on. Transistors 920, 929, 933 and 934 are then connected in a configuration similar to 919, 928, 931 and 932 so the gate of transistor 920 can drive the gates of transistors 919 and 920 to assure they are turned on and sufficiently biased.

FIG. 9 further includes two inverter references, a first formed by PMOS transistor 910 and NMOS transistor 917, with the gate of transistor 910 connected to its drain. A second inverter reference is formed by PMOS transistor 902 and NMOS transistor 903, with the gate of transistor 902 connected to its drain. The NMOS transistors 903 and 917 receive a voltage reference VBSNRF set to just turn on an NMOS transistor 623 so that only a weak current is drawn. The voltage reference VPDSLEW generated at the common drains of transistors 902 and 903 will be a NMOS diode voltage above IOGND, to minimally turn on the PMOS transistor 902 and the NMOS transistor 903. A similar voltage reference VBSPRF is provided from the common drains of transistors 910 and 911. Although two separate inverter references provide VPDSLEW and VBSPRF, a single inverter reference might be used.

The reference VBSPRF is then provided to the gate of PMOS transistors 904, 905 and 911. The transistors 904, 905 and 911 receive the minimal PMOS turn on reference VBSNRF to provide a 1 vt voltage drop from IODD. The current drawn enables a weak bias reference current to be provided to draw minimal power in steady state operation, but significant current from IODD during switching. Transistor 904 drives transistors 931 and 932 through PMOS transistor 906. Separation of transistors 904 and 932 using 906 enables VRFPPDA to be provided independent of changes in IODD. The transistor 911 drives the gate of transistor 926 simulating current provided from transistor 704 in FIG. 7A. Transistor 905 drives transistor 909.

Thus, in operation to provide VRFPPD, the circuit of FIG. 9 provides sufficient current to VRFPPD to turn on the gate of transistor 713 in FIG. 7A to drive the gate of transistor 143a shown in FIG. 7B during a low to high transition of the PAD. Should a significant load be on the PAD, the required drive current at the gate of transistor 913 will increase to pull down VRFPPD resulting in the drain of transistor 928 providing the necessary current. With the signal VRFPPD driving the gate of transistor 913, which functions to provide current to drive the gate of transistor 913 to IOGND during low to high output transitions of the PAD, the drive current of transistor 143a will be precisely controlled to be a desired level.

Once the gate of transistor 143a is transitioned so that the PAD is high, the gate of transistor 143a is driven directly from the reference VRFPDA to assure transistor 143a remains off with a weaker drive current to prepare for a subsequent high to low transition. The signal VRFPDA is provided from the sources of PMOS transistors 924 and 924B. Transistors 924 and 924B are PMOS devices with drains connected through PMOS transistors current mirror transistors 918 and 918B to IODD.

The gates of transistors 924 and 924B are driven by the signal from transistor 928 controlling VRFPPDA. Thus, transistors 924 and 924B provide the same drive current as set by VRFPPDA while VRFPPDA is still applied, and then a voltage at the gates of 924 and 924B is provided to minimally turn them on with a weak bias current. The drains of transistors 924 and 924B are connected to IODD through respective PMOS transistors 918 and 918B. The drain of transistor 918 is further connected to the gate of a transistor 923 and to the drain of transistor through PMOS transistor 925. The gates of the PMOS transistors 918 and 918B are connected to the drain of transistor 922. The gate of transistor 922 is connected to the source of PMOS transistor 921 which mimics transistor 713 of FIG. 7A. Transistors 922 and 923 have common drains connected through a current sink transistor 930 to IODD. PMOS transistors 913 and 914 are connected in a current mirror configuration to drive the drains of transistors 913 and 914.

The sizes of the transistors 904 and 906 in the circuit providing VRFPPDA, VRFPDA are different than the size of similar circuitry providing VRFPPDB, VRFPDB to enable a different current drive strength to be provided by each circuitry.

In operation, the transistors 913, 914, 922 and 923 are designed to draw the minimal drive current necessary, so transistors 924 and 924B which control VRFPDA will provide a minimum drive current to VRFPDA once the gate voltage on transistors 924 and 924B is minimized when VRFPPDA is disconnected. The signal from the gate of transistor 921 providing VRFPPDA during the final transition of the PAD from low to high will control the drive current to the gate of transistor 922, and to the gates of transistors 925 and 924B. Transistor 918B will then provide sufficient current to VRFPDA during the final transition off of VRFPPDA. Once transistor 713 of FIG. 7A is off and VRFPPDA is no longer applied, VRFPDA will directly control the gate of transistor 923. Transistor 923 then controls transistors 914 and 913 so that transistor 922 sets the gate voltage on transistors 918 and 918B at a minimum. Transistors 918B and 924B will assure the minimum value for VRFPDA to drive the gate of a PMOS transistor 714 of FIG. 7A to minimally turn it on.

3. Operational Amplifier For References

Figure 10:
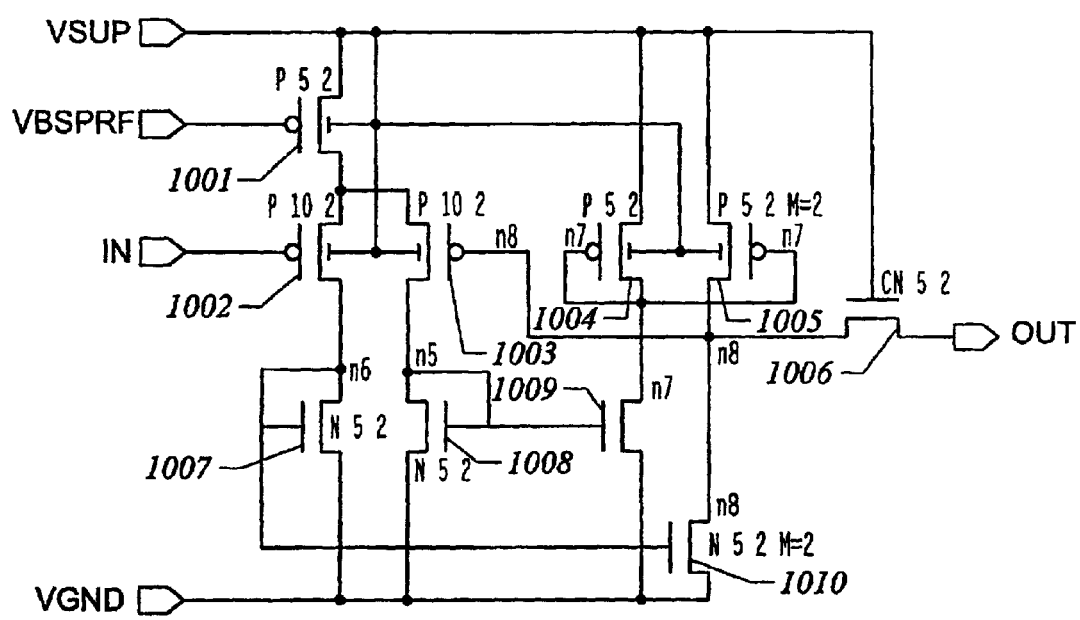
FIG. 10 shows an operational amplifier used in the reference circuits of FIGS. 8A–E and 9.

FIG. 10 shows an operational amplifier with an amplification of 1 used in the pull up reference circuit of FIGS. 8 and the pull down reference circuit of FIG. 9. The circuit receives a reference VBSPRF designed to turn on a PMOS transistor with a PMOS diode drop, a VDD supply VSUP, a VSS or VGND connection, and an input IN. The input IN drives the one input of a differential amplifier formed by common source transistors 1021 and 1003, at the gate of transistor 1021, while a second input is connected to the gate of transistor 1003. A PMOS transistor 1011 forms a current source by connecting the source of transistors 1021 and 1003 to VSUP and receiving VBSPRF at its gate. NMOS transistor n6 provides a current sink to connect the source of transistor 1021 to VGND, while transistor 1003 provides a current sink connecting the source of transistor 1003 to VGND.

Transistor 1007 is connected as a current mirror with transistor 1010, while transistor n5 is connected as a current mirror with transistor 1009. Transistor 1004 has its gate and drain connected together in a diode fashion to form a current mirror with transistor 1005, and sinks current from VSUP to the drain of transistor 1009. Transistor 1005 sinks current from VSUP to the drain of transistor 10010. The gate of transistor 1003 and drain of transistor 1005 are connected together to provide the output OUT through transistors 1006.

In operation, the input drives transistor 1021, and has sunk through transistor 1007 that is mirrored in transistor 1010 of the same size as 1021. Transistor 1005 is the same size as transistor 1002 and sinks an identical current to 1021 so that the current through it will the same as transistor 1002, and its gate voltage will mimic the input IN. Transistor 1004 being the same size as 1005 will then provide the same current of 1010 through 1009. Transistor 1009 being a current mirror with 1008 and the same size will provide the same current through 1008 as 1009, and transistor 1003 will then be providing the same current as 1002 since it is the same size. With transistors 1004 and 1005 providing an identical drain current and having connected gates, node n8 will have a voltage and current the same as IN provided at the output OUT, with VSUP keeping transistor 1006 on. The current mirrors will provide buffering to feedback from affecting the input signal.

III. ESD Protection Circuit For I/O Buffer

A. ESP Protection Circuitry

Figure 11:
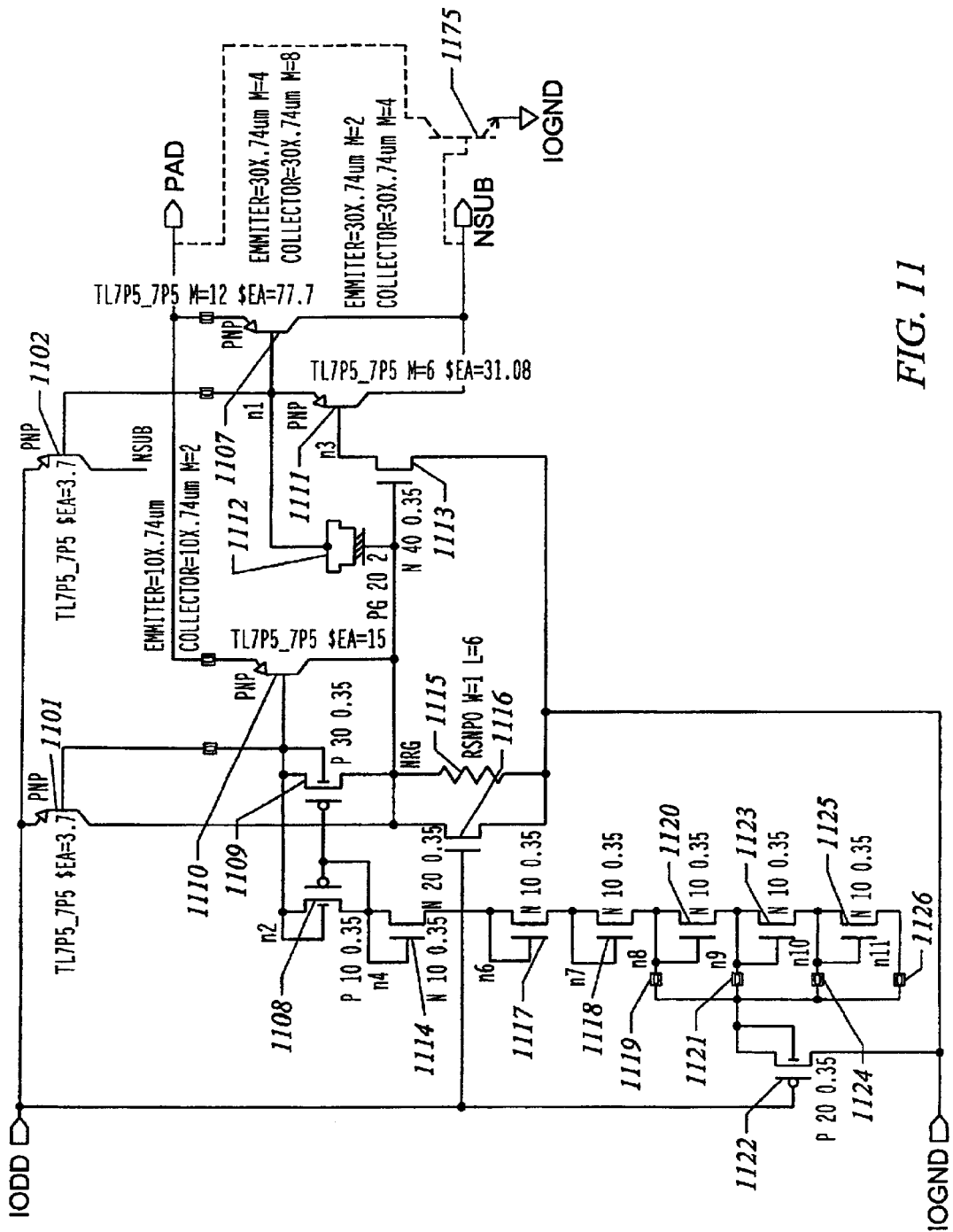
FIG. 11 shows circuitry for clamping the pad voltage.

FIG. 11 shows circuitry connected to the PAD to provide ESD protection and to clamp the output at a maximum voltage to prevent transistor damage. The circuitry of FIG. 11 includes a lateral BJT 1175 (shown in dashed lines) formed using the substrate, the BJT 1175 being an NPN transistor. With the transistor 1175 being a BJT, it will have no gate oxide, unlike CMOS devices. For example, for a 2.5 volt CMOS device, the gate oxide for CMOS transistors can only handle approximately 3.0 volts while the BJT can handle significantly more.

The structure of the lateral BJT 1175 is provided in a p– epitaxial layer in a p+ substrate. The p+ substrate is heavily doped to provide a 0.1 Ω-cm resistivity and is approximately 600 μm thick, while the p– epitaxial layer is approximately 7 μm thick, and is lightly doped to provide about a 10 Ω-cm resistivity. The lateral BJT 1175 is formed by n+ implant regions in the p– epitaxial layer along with a p+ implant region. The n+ region forms an emitter region for the lateral BJT and is connected to ground, while the n+ region forms a collector region connected to the pad. The p+ implant region connects to a contact node NSUB and forms a base region for the BJT.

With the pad being coupled to node NSUB, during an ESD event when a large voltage is applied between the pad and a ground pin, node NSUB will pull up the p– epitaxial region to turn on the lateral BJT. Similar to gate aided breakdown, with the NPN BJT transistor turning on, the pad will be connected to ground. More details of lateral BJT 1175 are described in U.S. Pat. No. 6,028,758 to Sharp-Geisler, which is incorporated herein by reference in its entirety.

B. Circuitry To Clamp Pad Voltage

The ESD protection circuitry further includes circuitry to clamp the pad voltage below a desired maximum value during an ESD event to prevent damage to other transistors connected to the pad.

The BJTs 1111 and 1107 are PNP type transistors forming a Darlington pair. A Darlington pair offers a low emitter impedance since the transistors 1111 and 1107 are connected as emitter followers with the emitter of 1111 connected to the base of 1107. With the emitter of transistor 1107 connected to the pad, a low impedance path is offered from the pad to node NSUB to carry the potentially high ESD current without a correspondingly high voltage increase. Further, PNP BJTs 1101 and 1107 are used in the path between the pad and ground because they do not have a gate oxide which can be damaged by a potentially high ESD voltage.

The base of BJT 1111 is driven in an ESD event by NMOS transistor 1113. The gate of NMOS transistor 1113 is connected to the collector of PNP BJT transistor 1110 as well as the drain of PMOS transistor 1109 which forms a current mirror with transistor 1108. The base of BJT transistor 1110 is connected to common sources of transistors 1108 and 1109. Transistor 1108 has a source connected through a series of diode connected NMOS transistors 1114, 1117, 1118, 1120, 1123 and 1125. Transistors 1120, 1123 and 1125 have gates connected through a PMOS transistor 1122 to IOGND. An NMOS transistor 1116 is connected in parallel with resistor 1115 between the gate of transistor 1113 and IOGND. Gates of transistors 1116 and 1122 are connected to IODD.

During an ESD event, IODD will be at 0V, so transistor. 1116 will turn off, and transistor 1122 will turn on. The voltage on the PAD will then be clamped to the diode voltages of transistors 1118, 1117 and 1114 in series, or 3 vt=3*0.7=2.1 volts. Any of the break points 1119, 1121, 1124 or 1126 could be broken to add an additional diode drop as designs might require. Current is provided from both transistor 1109 and BJT transistor 1110 to turn on transistor 1113 so that the voltage on the base of transistor 1111 as created by transistor 1113 turn on transistors 1111 and 1107 to match the; PAD voltage. Likewise, transistor 1112 pulls up the base of transistor 1107 to provide the maximum level at the emitter 1107 of the clamped pad voltage.

When the part is powered up, and IODD rises, transistor 1122 is turned off to disconnect the clamping voltage from the PAD. Transistor 1116 turns on to bypass resistor 1115 to turn off transistor 1113 to prevent clamping the PAD voltage.

To further optimize the operation of the clamp circuit of FIG. 11, BJT transistors 1101 and 1102 are optionally included. The transistor 1101 serves to limit the capacitance between the base of transistor 1107 and emitter of the transistor 1101. The transistor 1102 has an emitter connected to IODD which may be the 3.3 volt pin connection. When transistor 1102 turns on during an ESD event, the node IODD can be pulled up to 3.3 volts. Transistor 1102 will then provide a 1 vt drop from the IODD node to pull the base of transistor 1107 to 2.6 volts. When an ESD event occurs the base of transistor 1107 is at 0 volts. When the pad is pulled high the base-emitter diode of transistor 1107 will forward bias until the base of 1107 is pulled up. The capacitance on the base of transistor 1102 shows up in the emitter load current as the base capacitance multiplied by the gain of transistor 1102. The base of transistor 1102 will be formed so that its capacitance will be a large n-well capacitance. If the collector of transistor 1101 is grounded, its base capacitance will show up at its emitter multiplied by its gain. The capacitance at the emitters of transistors 1102 and 1101 then add up to provide a considerable amount of gain. Once the base of transistor 1107 is pulled up to 1 vt below 3.3 volts by transistor 1102, the capacitance described no longer shows up. Transistor 1101 provides a similar function of capacitance reduction for transistor 1110.

IV. Overall I/O Buffer Block Diagram

Figure 12A:
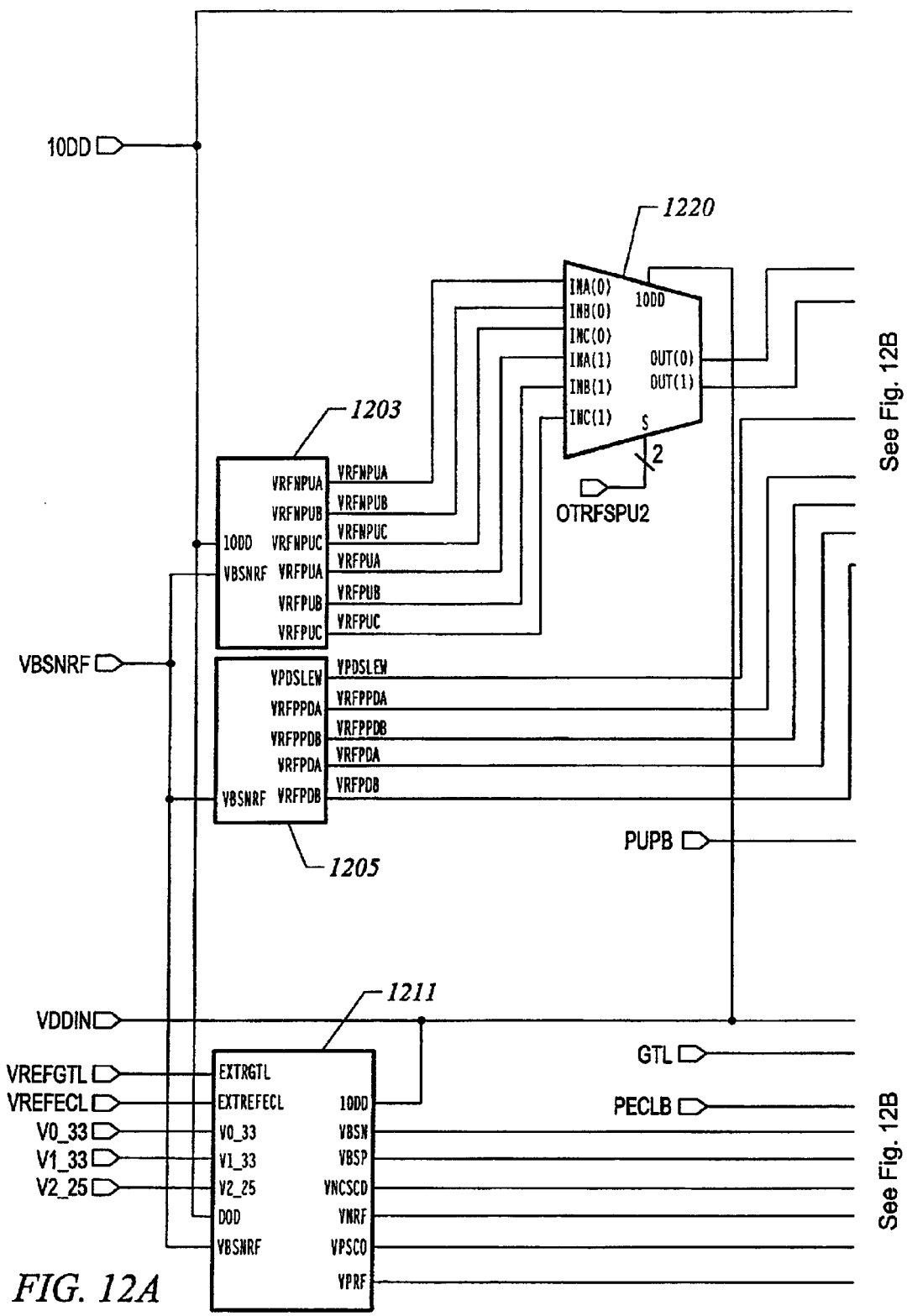
FIGS. 12A–B shows an overall block diagram for the I/O buffer in accordance with the present invention.
Figure 12B:
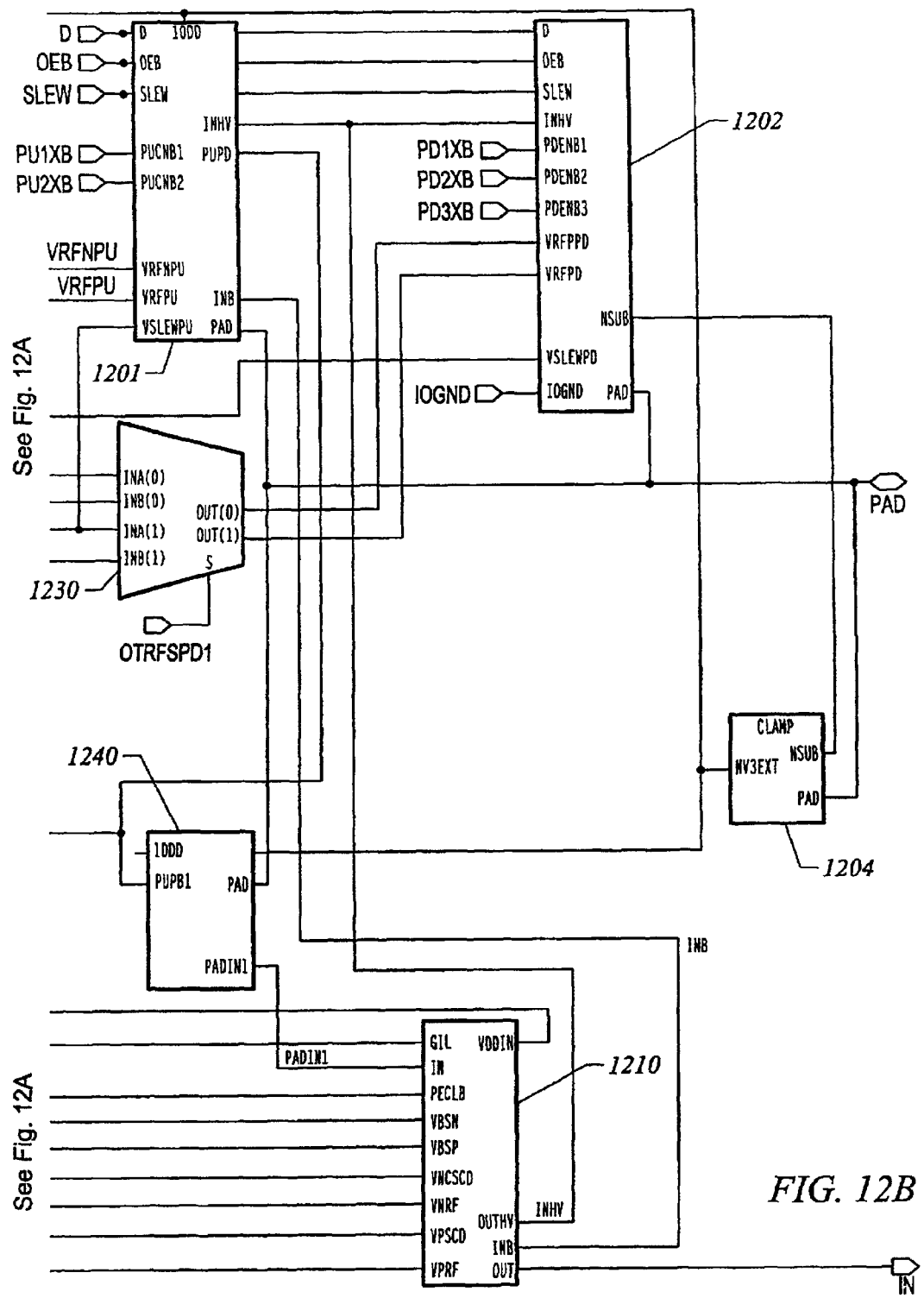

FIG. 12 shows a block diagram for components of an I/O buffer system in accordance with the present invention. The block diagram shows an arrangement of components such as that described and shown in FIGS. 1–11.

The circuit of FIG. 12 includes an input buffer 1210 with structure as shown in FIG. 1. The input buffer 1210 receives the GTL and PECLB signals input to the I/O buffer. Reference inputs PECLB, VBSN, VBSP, VNCSCD, VNRF, VPCSCD and VPRF are provided from the reference circuit 1211 having components as shown in FIGS. 5A–5C. The reference circuit 1211 receives VREFECL, VREFGTL, V0_33, V1_33, and V2_25 signals input to the I/O buffer. VDD is provided from the I/O buffer to the VDDIN connection, and the circuit 1210 provides IN as an output OUT. The INB output of input buffer 1210 is provided to the INB input of output buffer circuits 1201 and 1202.

The pull up buffer circuitry 1201 has circuitry as shown in FIG. 6, while the pull down circuitry 1202 has circuitry as shown in FIG. 7. The data input D is provided to the D input of the output buffer circuits 1201 and 1202 as is the current supply IODD and ground IOGND. The substrate connection NSUB is provided from the circuits 1201 and 1202 along with a PAD connection. A first set of pull up and pull down enable signals PU1XB and PD1XB are provided to the first output buffer circuit 1202, while a second set of signals PU2XB and PD2XB are provided to output buffer circuit 1201. A common output enable signal OEB and slew rate control signal SLEW are provided as inputs to the circuits 1201 and 1202.

The output buffer pull up circuit 1201 receives reference circuit signals VRFNPU and VRFPU from a multiplexer circuit 1220 which programmably selects between the signals VRFNPUA-C and VRFPUA-C depending on the desired drive current as provided from the reference circuit 1203. The signals VRFNPUA-C and VRFPUA-C are provided from reference circuit 1203 which has components shown in FIG. 8. The output buffer pull down circuit 1202 receives reference circuit signals VRFPPD and VRFPD from a multiplexer circuit 1230 which programmably selects between the signals VRFPPDA-B and VRFPDA-B. The signals VRFPPDA-B and VRFPDA-B are provided from reference circuit 1205 which has components shown in FIG. 9.

Circuitry 1204 is provided to clamp the pad voltage for ESD protection. Details of the clamp circuitry 1204 are shown in FIG. 11. The current supply to the circuit IODD is provided to drive the NV3EXT 3.3 volt input of the clamp circuitry 404.

Power up control circuitry 1240 is provided to prevent a connection from between (1) the actual PAD and PAD outputs of output buffer circuits 1201 and 1202 and (2) the input IN of the input buffer circuit 1210 during startup to prevent instability. During startup PUPB is a low signal, and serves to disconnect the output PAD from the output PADINT. After startup when PUPB goes high, the PAD and PADINT are connected.

Although the present invention has been described above with particularity, this was merely to teach one of ordinary skill in the art how to make and use the invention. Many additional modifications will fall within the scope of the invention, as that scope is defined by the claims which follow.

What is claimed is:
1. A buffer comprising:
   an output signal node for receiving a data signal to be provided to an external circuit;
   an output pad for connecting to the external circuit;
   a driver transistor having a source-drain path connecting a first power supply terminal to the output pad, and having a gate;

switching transistors connected to the output signal node and the gate of the driver transistor to provide a signal to the gate of the driver transistor based on a state of the data signal; and a connecting means which is connected to the first power supply terminal, a second power supply terminal, and the output pad, the connecting means for connecting the output pad to the second power supply terminal when a voltage on the output pad exceeds a voltage on the first power supply terminal, wherein the connecting means comprises:

an overvoltage resistor having a first terminal connected to the pad, and having a second terminal; and a pass gate transistor having a first terminal coupled to the second terminal of the overvoltage resistor, a second terminal coupled to a second power supply terminal, and having a gate connected to the first power supply terminal.

2. The buffer of claim 1, further comprising:

a first transistor having a source-drain path coupling the gate of the driver transistor to the second power supply terminal, and having a gate coupled to the output signal node, wherein the source-drain path of the first transistor further couples the second terminal of the pass gate transistor to the second power supply terminal.

3. The buffer of claim 2, further comprising:

an input buffer having an input connected to the pad and an output, and a second transistor having a source-drain path coupling the gate of the driver transistor to the second power supply terminal, and having a gate coupled to the output of the input buffer, wherein the source-drain path of the second transistor further couples the second terminal of the pass gate transistor to the second power supply terminal.

4. A buffer comprising:

an output signal node for receiving a signal to be provided to an external circuit;

an output pad for connecting to the external circuit;

a first PMOS pull up transistor having a drain coupled to the output pad, a source coupled to a first power supply terminal, and having a gate forming a first node; and PMOS pull up switching transistors each having source-drain paths coupling the first power supply terminal to the gate of the first PMOS pull up transistor, and having a gate coupled to the output signal node;

a common n-well within which the first PMOS pull up transistor and the plurality of PMOS pull up switching transistors are formed;

a first PMOS protection transistor having a source-drain path connecting the common n-well to the first power supply terminal;

an overvoltage resistor having a first terminal connected to the pad, and having a second terminal; and series connected PMOS pass gate transistors having a first common connected terminals coupled to the second end of the overvoltage resistor and a gate of the first PMOS protection transistor, a second terminal coupled to the first power supply terminal, a third terminal coupled to a second power supply terminal, and having common gates connected to the first power supply terminal.

5. The buffer of claim 4, further comprising:

a first NMOS transistor having a source-drain path coupling the first node to the second power supply terminal, and having a gate coupled to the output signal node, wherein the source-drain path of the first NMOS transistor further couples the third terminal of the series connected PMOS transistors to the second power supply terminal.

6. The buffer of claim 5, wherein the output buffer portion further comprises:

a second PMOS protection transistor having a source-drain path connecting the first power supply terminal to the second terminal of the series connected PMOS pass gates, and having a gate connected to the third terminal of the series connected PMOS pass gates.

7. The buffer of claim 6, further comprising:

an input buffer having an input connected to the pad and an output; and a second NMOS transistor having a source-drain path coupling the first node to the second power supply terminal, and having a gate coupled to the output of the input buffer, wherein the source-drain path of the second NMOS transistor further couples the third terminal of the series connected PMOS pass gate transistors to the second power supply terminal.

8. The buffer of claim 6, wherein the series connected PMOS pass gate transistors, the first PMOS protection transistor and the second PMOS protection transistor arm provided in the common n-well.

9. A buffer comprising:

an output signal node for receiving a data signal to be provided to an external circuit;

an output pad for connecting to the external circuit;

a driver transistor having a source-drain path connecting a first power supply terminal to the output pad, and having a gate, wherein the driver transistor comprises a PMOS pull up transistor;

switching transistors connected to the output signal node and the gate of the driver transistor to provide a signal to the gate of the driver transistor based on a state of the data signal, wherein the switching transistors comprise PMOS switching transistors;

a common n-well wherein the PMOS driver transistor and switching transistors are formed; and a connecting means which is connected to the first power supply terminal, a second power supply terminal, and the output pad, the connecting means for connecting the output pad to the second power supply terminal when a voltage on the output pad exceeds a voltage on the first power supply terminal.

10. The buffer of claim 9, wherein the connecting means comprises:

a first PMOS protection transistor having a source-drain path connecting the common well to the first power supply terminal; and a PMOS pass gate transistor having a gate terminal coupled to the source-drain path of the first PMOS protection transistor, a second terminal coupled to a second power supply terminal, and a third terminal connected to the first power supply terminal and to a gate of the first PMOS protection transistor.

11. The buffer of claim 10, further comprising:

a first NMOS transistor having a source-drain path coupling the gate of the PMOS pull up transistor to the second power supply terminal, and having a gate coupled to the output signal node, wherein the source-drain path of the first NMOS transistor further couples the second terminal of the PMOS pass gate transistor to the second power supply terminal.

12. The buffer of claim 11, further comprising:

a second PMOS protection transistor having a source-drain path connecting the first power supply terminal to the third terminal of the PMOS pass gate transistor, and having a gate connected to the second terminal of the PMOS pass gate transistor.

13. The buffer of claim 12, further comprising:

an input buffer having an input connected to the pad and an output, and a second NMOS transistor having a sourced path coupling the gate of the PMOS pull up transistor to the second power supply terminal, and having a gate coupled to the output of the input buffer, wherein the source-drain path of the second NMOS transistor further couples the second terminal of the PMOS pass gate transistor to the second power supply terminal.

14. The buffer of claim 12, wherein the PMOS pass gate transistor, the first PMOS protection transistor and the second PMOS protection transistor are provided in the common n-well.

\* \* \* \* \*